(12) United States Patent
Kim et al.

(10) Patent No.: US 8,945,985 B2
(45) Date of Patent: Feb. 3, 2015

(54) SEMICONDUCTOR PACKAGE AND METHOD OF MANUFACTURING THE SAME

(71) Applicants: Won-keun Kim, Hwaseong-si (KR); Hyun-jung Song, Hwaseong-si (KR); Eun-young Choi, Hwaseong-si (KR); Hye-young Jang, Yongin-si (KR)

(72) Inventors: Won-keun Kim, Hwaseong-si (KR); Hyun-jung Song, Hwaseong-si (KR); Eun-young Choi, Hwaseong-si (KR); Hye-young Jang, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/158,131

(22) Filed: Jan. 17, 2014

(65) Prior Publication Data

US 2014/0134798 A1    May 15, 2014

Related U.S. Application Data

(62) Division of application No. 13/565,111, filed on Aug. 2, 2012, now Pat. No. 8,653,676.

(30) Foreign Application Priority Data

Oct. 4, 2011    (KR) .......................... 10-2011-0100767

(51) Int. Cl.
*H01L 21/00* (2006.01)
*H01L 25/00* (2006.01)
(Continued)

(52) U.S. Cl.
CPC .......... *H01L 25/50* (2013.01); *H01L 23/49816* (2013.01); *H01L 23/49827* (2013.01); *H01L 21/561* (2013.01); *H01L 24/97* (2013.01); *H01L 24/19* (2013.01); *H01L 24/20* (2013.01); *H01L 24/81* (2013.01); *H01L 25/0657* (2013.01); *H01L 23/3128* (2013.01); *H01L 23/3135* (2013.01); *H01L 23/481* (2013.01);
(Continued)

(58) Field of Classification Search
CPC ... H01L 21/563; H01L 21/56; H01L 23/3157; H01L 23/28; H01L 23/3185; H01L 23/3192; H01L 33/52; H01L 21/00
USPC .......... 438/127, 112, 124, 126, 107, 109, 110
See application file for complete search history.

(56) References Cited

U.S. PATENT DOCUMENTS 4,996,082 A * 2/1991 Guckel et al. .................. 438/51
5,629,566 A   5/1997 Doi et al.
(Continued)

FOREIGN PATENT DOCUMENTS

JP    2009-260302 A    11/2009

*Primary Examiner* — S. V. Clark
(74) *Attorney, Agent, or Firm* — Harness, Dickey & Pierce, P.L.C.

(57) ABSTRACT

A semiconductor package including an internal package including at least one semiconductor chip sealed with an internal seal, an external substrate on which the internal package is mounted, and an external seal sealing the internal package is provided. Also provided is a method of manufacturing the semiconductor package including forming an internal package including at least one semiconductor chip sealed with an internal seal, mounting the internal package on an external substrate, and sealing the internal package with an external seal. The internal seal and the external seal have different Young's moduli, for example, a Young's modulus of the internal seal is smaller than a Young's modulus of the external seal. Accordingly, the semiconductor package is less susceptible to warpage and can be handled with relative ease in subsequent semiconductor package processes.

13 Claims, 28 Drawing Sheets

(51) Int. Cl.
- H01L 23/498 (2006.01)
- H01L 21/56 (2006.01)
- H01L 23/00 (2006.01)
- H01L 25/065 (2006.01)
- H01L 23/31 (2006.01)
- H01L 23/48 (2006.01)
- H01L 25/10 (2006.01)

(52) U.S. Cl.
CPC .......... *H01L2224/13025* (2013.01); *H01L 2224/16145* (2013.01); *H01L 2224/16225* (2013.01); *H01L 2224/32145* (2013.01); *H01L 2224/32225* (2013.01); *H01L 2224/48145* (2013.01); *H01L 2224/48227* (2013.01); *H01L 2224/73204* (2013.01); *H01L 2224/97* (2013.01); *H01L 2924/1431* (2013.01); *H01L 2924/1434* (2013.01); *H01L 2924/15311* (2013.01); *H01L 2924/18161* (2013.01); *H01L 2924/19104* (2013.01); *H01L 2924/19105* (2013.01); *H01L 2924/01029* (2013.01); *H01L 2224/73265* (2013.01); *H01L 2924/01327* (2013.01); *H01L 2924/10253* (2013.01); *H01L 2224/04105* (2013.01); *H01L 2224/12105* (2013.01); *H01L 2224/94* (2013.01); *H01L 2225/06586* (2013.01); *H01L 25/0652* (2013.01); *H01L 25/0655* (2013.01); *H01L 25/105* (2013.01); *H01L 2225/0651* (2013.01); *H01L 2225/06513* (2013.01); *H01L 2225/06541* (2013.01); *H01L 2225/06565* (2013.01); *H01L 2225/06562* (2013.01); *H01L 2225/06548* (2013.01); *H01L 2224/0557* (2013.01); *H01L 2924/30107* (2013.01)

USPC .......................................... 438/107; 438/127

(56) References Cited

U.S. PATENT DOCUMENTS

| | | | |
|---|---|---|---|
| 6,407,461 | B1 | 6/2002 | Farquhar et al. |
| 6,414,391 | B1 | 7/2002 | Corisis et al. |
| 6,414,394 | B1 | 7/2002 | Ito et al. |
| 6,552,263 | B2 * | 4/2003 | Farquhar et al. ............ 174/521 |
| 7,199,479 | B2 | 4/2007 | Wu |
| 7,259,455 | B2 * | 8/2007 | Seto .......................... 257/700 |
| 7,273,770 | B2 * | 9/2007 | Edelstein et al. ............ 438/126 |
| 7,830,023 | B2 * | 11/2010 | Enomoto ..................... 257/783 |
| 2006/0163745 | A1 | 7/2006 | Yamashita et al. |
| 2010/0102459 | A1 | 4/2010 | Satou |
| 2012/0018884 | A1 * | 1/2012 | Lin et al. ...................... 257/738 |
| 2012/0248616 | A1 | 10/2012 | Kitajima et al. |
| 2013/0119493 | A1 | 5/2013 | Chou et al. |

* cited by examiner

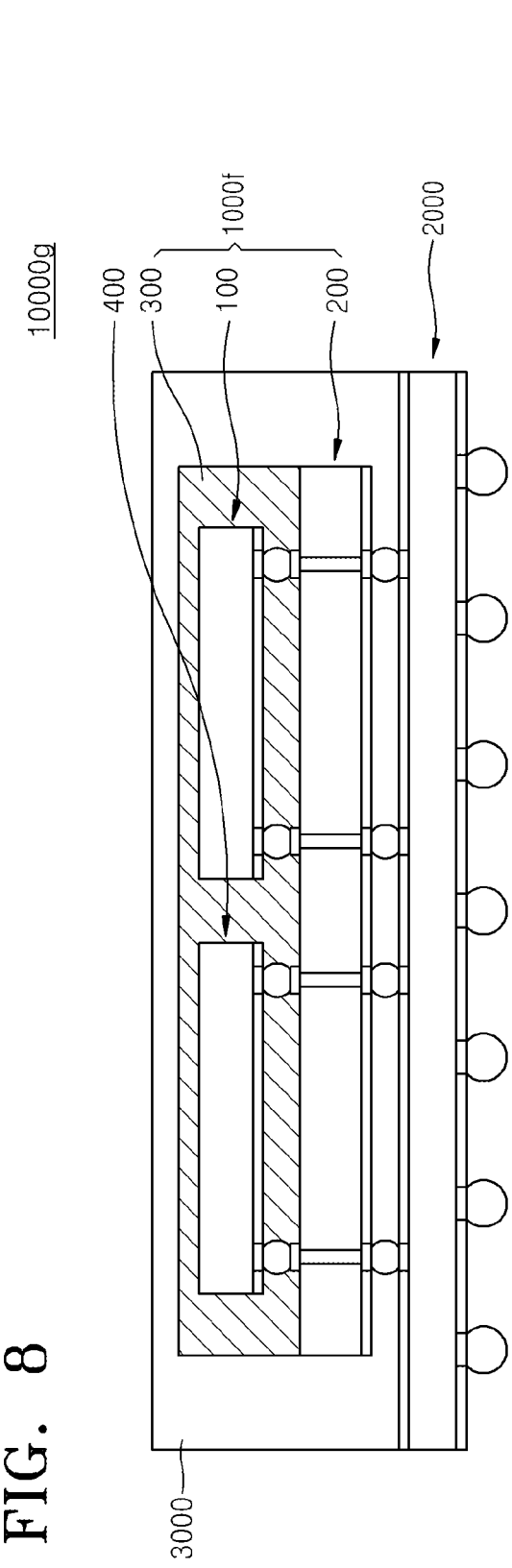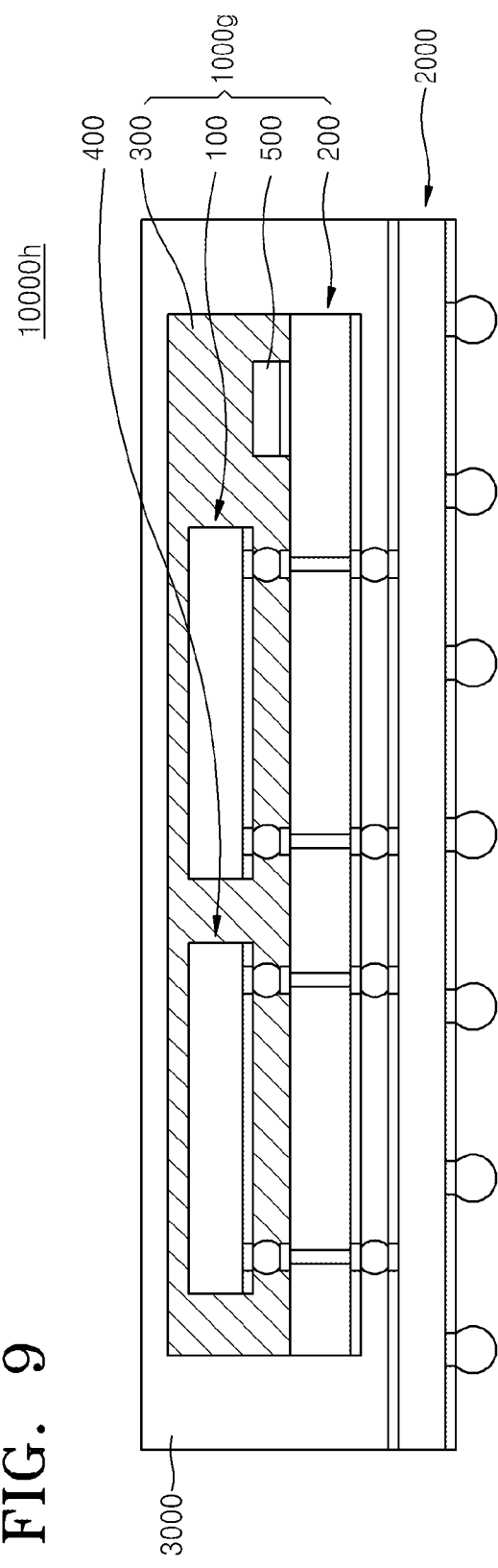

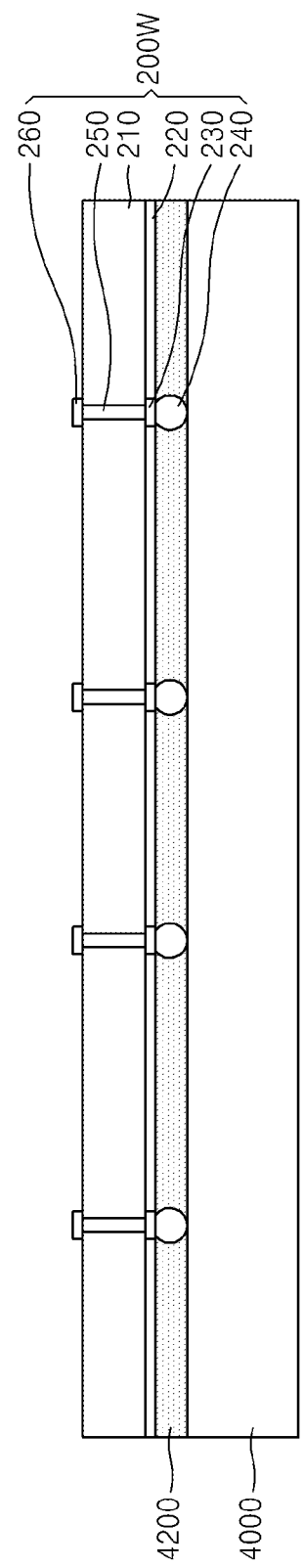

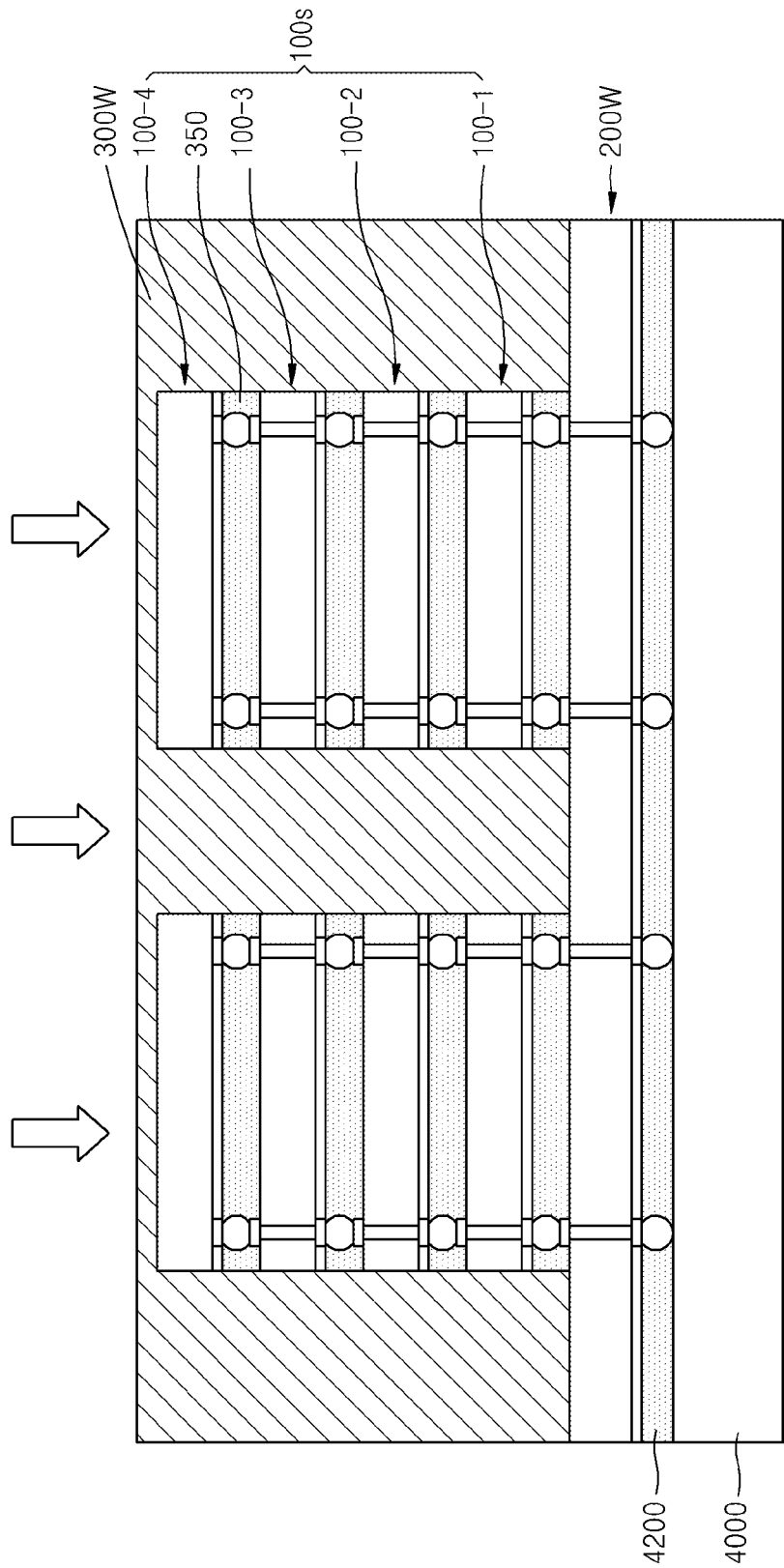

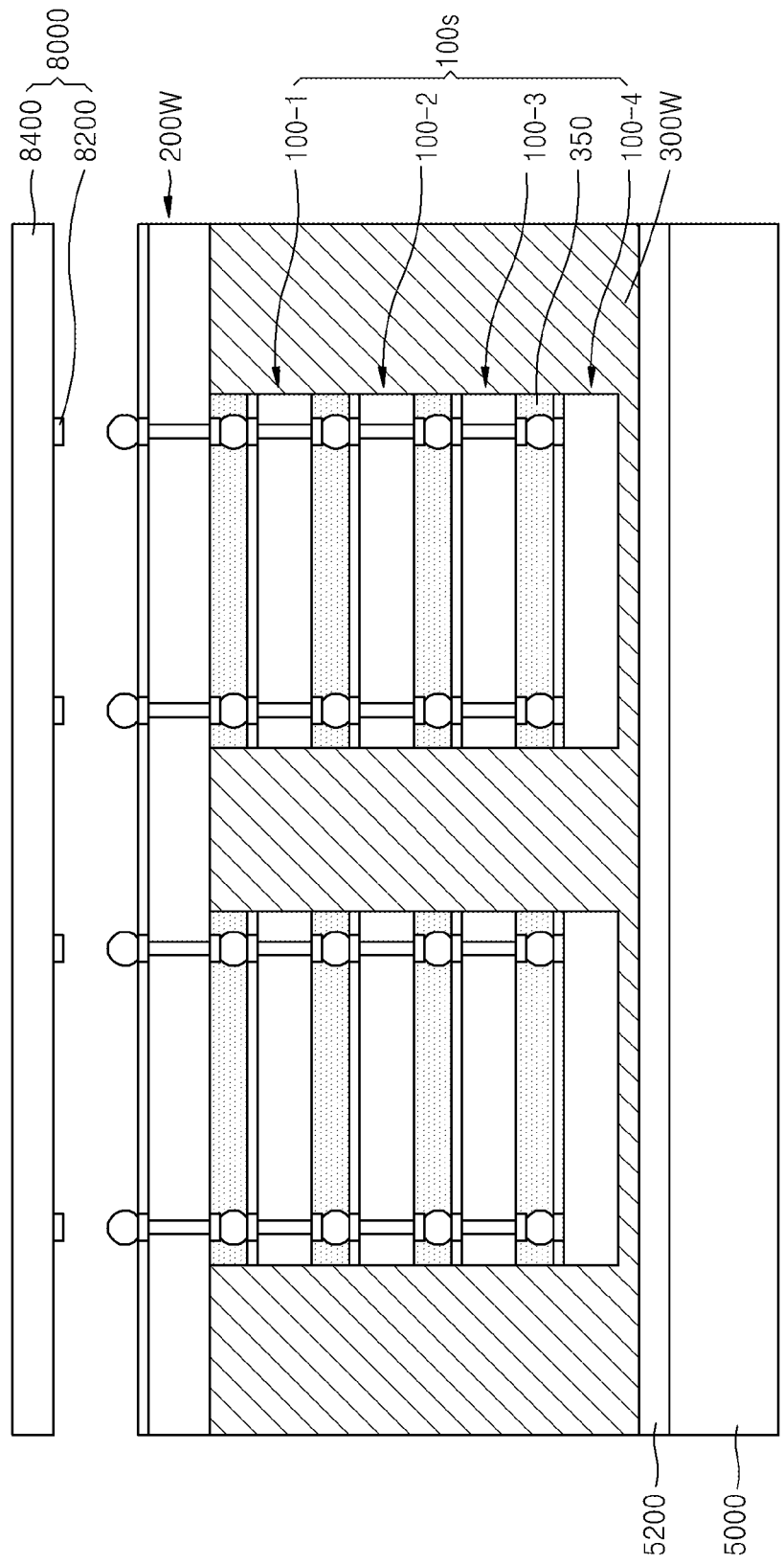

SEMICONDUCTOR PACKAGE AND METHOD OF MANUFACTURING THE SAME

CROSS-REFERENCE TO RELATED APPLICATIONS

This application is a divisional application of U.S. application Ser. No. 13/565,111, filed on Aug. 2, 2012, which claims priority under 35 U.S.C. §119 to Korean Patent Application No. 10-2011-0100767, filed on Oct. 4, 2011, in the Korean Intellectual Property Office (KIPO), the disclosure of each of which is incorporated herein in its entirety by reference.

BACKGROUND

The inventive concepts relates to semiconductor packages, and more particularly, to semiconductor packages with reduced stress and/or methods of manufacturing the same.

In general, semiconductor chips formed by performing several semiconductor processes on a wafer undergo a packaging process to thereby form a semiconductor package. A semiconductor package may include a semiconductor chip, a printed circuit board (PCB) on which the semiconductor chip is mounted, a bonding wire or a bump that electrically connects the semiconductor chip to the PCB, and a seal that seals the semiconductor chip. With higher integration of semiconductor packages, the reliability and workability of the semiconductor packages is desired.

SUMMARY

The inventive concepts provide a semiconductor package with reduced stress that is easy to be handled in a semiconductor package process and that reduces or effectively prevents warpage, and/or a method of manufacturing the semiconductor package.

According to an example embodiment of the inventive concepts, a semiconductor package may include an internal package including at least one semiconductor chip and sealed with an internal seal, an external substrate on which the internal package is mounted, and an external seal sealing the internal package, wherein the internal seal and the external seal have different Young's moduli.

The Young's modulus of the internal seal may be smaller than the Young's modulus of the external seal.

The internal seal may include at least one of a silicone-based material, a thermosetting material, a thermoplastic material, and a UV curable material, and the external seal may include at least one of an epoxy-based material, a thermosetting material, a thermoplastic material, and a UV curable material.

When the at least one semiconductor chip corresponds to a plurality of semiconductor chips, some of the semiconductor chips may be memory chips and the others may be logic chips.

The internal package may include through silicon vias (TSVs), and an internal substrate having a lower surface on which a connecting member connected to the TSVs is formed. The at least one semiconductor chip may be on the internal substrate and connected to the connecting member via the TSVs. The internal substrate may be mounted on the external substrate via the connecting member. When the at least one semiconductor chip corresponds to a plurality of semiconductor chips, the semiconductor chips may constitute a stacked chip portion formed in a multilayered structure on the internal substrate.

The internal substrate may be formed of an active wafer comprising a plurality of semiconductor chips that constitute the internal package, or may be formed of an interposer substrate comprising a plurality of unit interposers that constitute the internal package.

The internal package may be a wafer level package (WLP) having no internal substrates. The internal package may have a fan-in or fan-out structure.

According to an example embodiment of the inventive concepts, a semiconductor package may include an internal substrate having a TSV therein, a stacked chip portion on the internal substrate, an internal seal sealing the stacked chip portion, an external substrate on which the internal substrate is mounted, and an external seal sealing the internal substrate, the stacked chip portion, and the internal seal. The external seal has a larger Young's modulus than the internal seal. The stacked chip portion may be a stack of at least one semiconductor chip.

According to an example embodiment of the inventive concepts, a method of manufacturing a semiconductor package may include forming an internal package by sealing at least one semiconductor chip with an internal seal, mounting the internal package on an external substrate, and sealing the internal package with an external seal having a larger Young's modulus than the internal seal.

The forming an internal package may include forming an internal substrate, the internal substrate having a through silicon via (TSV), forming a plurality of stacked chip portions on the internal substrate, each of the plurality of stacked chip portions including a stack of semiconductor chips, sealing the plurality of stacked chip portions by using the internal seal, and dividing the sealed plurality of stacked chip portions into individual internal packages and each of the internal packages includes at least one of the stacked chip portions.

The forming an internal package may include preparing a base wafer, the base wafer having a through silicon via (TSV) and a connecting member, the connecting member, the connecting member on a lower surface of the base wafer and connected to the TSV, adhering the base wafer onto a first carrier substrate such that the lower surface of the base wafer faces the first carrier substrate, forming a plurality of stacked chip portions, each of the plurality of stacked chip portions including a stack of semiconductor chips on an upper surface of the base wafer, sealing the plurality of stacked chip portions with the internal seal, and exposing the connecting member by detaching the first carrier substrate from the base wafer. The forming an internal package may further include adhering a second carrier substrate to upper surfaces of at least one of the plurality of the stacked chip portions and the internal seal, performing an Electrical Die Sort (EDS) test on the stacked chip portions via the connecting member, dividing the sealed stacked chip portions into individual internal packages, each of the individual packages having at least one of the plurality of the stacked chip portions, and detaching the internal packages from the second carrier substrate.

The forming an internal package may include preparing a base wafer, the base wafer having a plurality of unit internal substrates, each of the unit internal substrates including at least one through silicon via (TSV) and at least one connecting member, the at least one connecting member on a lower surface of each of the unit internal substrates, dividing the base wafer into the plurality of unit internal substrates, mounting at least one of the unit internal substrates on a first carrier substrate such that the at least one connecting member faces the first carrier substrate, forming at least one stacked chip portion on the at least one of the unit internal substrates, the at least one stacked chip portion including the at least one semiconductor chip, sealing the at least one of the unit internal substrates and the at least one stacked chip portion with the internal seal, and exposing the connecting member by detaching the first carrier substrate from the unit internal substrates. The forming an internal package may further includes adhering a second carrier substrate to upper surfaces of at least one of the stacked chip portion and internal seal, performing an EDS test on the at least one stacked chip portion via the at least one connecting member, dividing the sealed unit internal substrate and the sealed at least one stacked chip portion into individual internal packages, each of the individual packages including the at least one stacked chip portion, and detaching the internal packages from the second carrier substrate.

According to an example embodiment of the inventive concepts, a method of manufacturing a semiconductor package may include forming an internal substrate, the internal substrate including a through silicon via (TSV), forming a plurality of stacked chip portions, each of the plurality of stacked chip portions formed by stacking at least one semiconductor chip on the internal substrate, sealing the stacked chip portions with an internal seal, dividing the sealed stacked chip portions into individual internal packages, each of the internal packages including at least one of the stacked chip portions, mounting a plurality of the internal packages on an external substrate, sealing the plurality of the internal packages with an external seal having a larger Young's modulus than the internal seal, and dividing the sealed internal packages into individual semiconductor packages, each of the semiconductor packges including at least one of the plurality of the internal packages.

The method may further include performing an EDS test on the plurality of the internal packages, before the dividing the sealed packages into individual internal packages.

BRIEF DESCRIPTION OF THE DRAWINGS

Example embodiments of the inventive concepts will be more clearly understood from the following detailed description taken in conjunction with the accompanying drawings in which:

FIGS. 1 through 5A and 5b through 14 are cross-sectional views of semiconductor packages according to some example embodiments of the inventive concepts;

FIGS. 15A through 15J are sectional views illustrating a method of manufacturing the semiconductor package illustrated in FIG. 5, according to an example embodiment of the inventive concepts;

Figure 1:
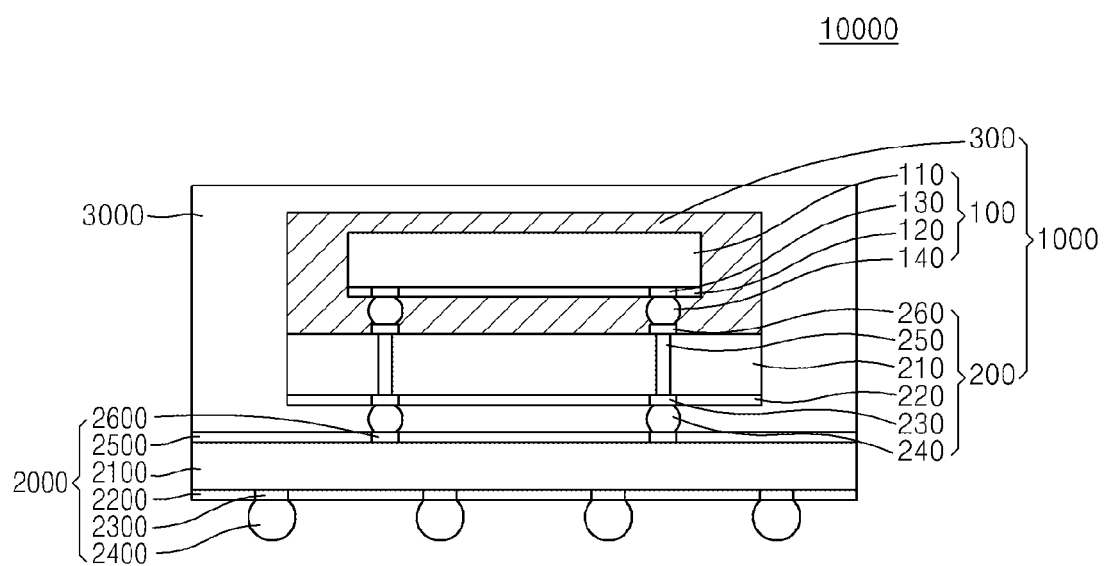

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

The inventive concept will now be described more fully with reference to the accompanying drawings, in which exemplary embodiments of the inventive concept are shown. The inventive concept may, however, be embodied in many different forms and should not be construed as being limited to the example embodiments set forth herein; rather, these embodiments are provided so that this disclosure will be thorough and complete, and will fully convey the inventive concept to those skilled in the art.

When an element is hereinafter referred to as being "connected" to another element, it can be directly connected to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on"). Similarly, when an element is referred to as being "on" another element or layer, the element can be directly on another element or intervening elements may be present.

In the drawings, the structure or size of each element is exaggerated for clarity and convenience of explanation, and portions not involved in the description are not illustrated. Like numbers refer to like elements throughout the specification. The terminology used herein is for the purpose of describing exemplary embodiments only and is not intended to be limiting of the inventive concept. Expressions such as "at least one of," when preceding a list of elements, modify the entire list of elements and do not modify the individual elements of the list.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1 through 14 are cross-sectional views of semiconductor packages 10000 to 10000m according to some example embodiments of the inventive concepts.

Referring to FIG. 1, the semiconductor package 10000 may include an internal package 1000, an external substrate 2000, and an external seal 3000. The internal package 1000 may be mounted on the external substrate 2000 and may be sealed by the external seal 3000. The internal package 1000 may include an internal substrate 200, a semiconductor chip 100, and an internal seal 300.

The internal substrate 200 may include a body portion 210, a passivation layer 220, lower pads 230, connecting members 240, through silicon vias (TSVs) 250, and upper pads 260. The internal substrate 200 may be formed based on an active wafer or an interposer substrate. The active wafer denotes a wafer on which a semiconductor chip may be formed, for example, a silicon wafer.

When the internal substrate 200 is formed based on an active wafer, the body portion 210 may include a semiconductor substrate (not shown), an integrated circuit layer (not shown), an interlayer insulation layer (not shown), and an inter-metal insulation layer (not shown). A multilayered wiring layer (not shown) may be formed within the inter-metal insulation layer. The semiconductor substrate may include a group IV material wafer, e.g., a silicon wafer, or a group III-V compound wafer. The semiconductor substrate may be formed of a single crystal wafer, e.g., a single crystal silicon wafer, according to forming methods. However, the semiconductor substrate is not limited to the single crystal wafer, and thus any of various wafers, e.g., an epitaxial wafer, a polished wafer, an annealed wafer, and a silicon on insulator (SOI) wafer, may be used as the semiconductor substrate. The epitaxial wafer denotes a wafer obtained by growing a crystal material on a single crystal silicon substrate.

Alternatively, when the internal substrate 200 is formed based on an active wafer, the body portion 210 may include only a semiconductor substrate. Accordingly, the body portion 210 may not include an integrated circuit layer, an interlayer insulation layer, and an inter-metal insulation layer.

When the internal substrate 200 is formed based on an interposer substrate, the body portion 210 may simply serve as a support substrate and may be formed of silicon, glass, ceramic, plastic, or the like.

The passivation layer 220 may be formed on a lower surface of the body portion 210 and protect the body portion 210 from external impact. The passivation layer 220 may be formed of an oxide layer, a nitride layer, or a double layer of an oxide layer and a nitride layer. For example, the oxide layer or the nitride layer may be a silicon oxide layer ($SiO_2$) or a silicon nitride layer ($SiN_x$) formed by a high-density plasma chemical vapor deposition (HDP-CVD) method.

The lower pads 230 may be formed of a conductive material on the lower surface of the body portion 210 via the passivation layer 220 and may be electrically connected to the TSVs 250. Although the lower pads 230 are directly connected to the TSVs 250 in FIG. 1, the lower pads 230 may be connected to the TSVs 250 via a wiring layer (not shown) included in the body portion 210. An under bump metal (UBM) may be formed on the lower pads 230.

The lower pads 230 may be formed of aluminum (Al), copper (Cu), or the like, and may be formed by pulse plating or direct current plating. However, the lower pads 230 are not limited to the aforementioned materials or methods.

The connecting members 240 may be formed on the lower pads 230. The connecting members 240 may be formed of a conductive material, e.g., copper (Cu), aluminum (Al), silver (Ag), tin, gold (Au), or solder. However, the material of the connecting members 240 is not limited thereto. Each of the connecting members 240 may be formed as multiple layers or a single layer. For example, when each of the connecting members 240 is formed as multiple layers, the connecting members 240 may include a Cu pillar and a solder. For example, when each of the connecting members 240 is formed as a single layer, the connecting members 240 may be formed of a tin-Ag solder or Cu.

The TSVs 250 may be connected to the lower pads 230 via the body portion 210. Although the TSVs 250 are formed as a via-last structure in the example embodiment, the TSVs 250 may be formed as a via-first or via-middle structure.

TSVs may be classified into TSVs with a via-last structure, TSVs with a via-first structure, and TSVs with a via-middle structure. A via-first structure denotes a structure in which a TSV is formed before an integrated circuit layer is formed, a via-middle structure denotes a structure in which a TSV is formed after formation of an integrated circuit layer before formation of a multi-layered wiring layer, and a via-last structure denotes a structure in which a TSV is formed after formation of a multi-layered wiring layer. According to example embodiments, the TSVs 250 are formed as via-last structures in which TSVs are formed after formation of a multi-layered wiring layer, and thus, may be directly connected to the lower pads 130 due to the via-last structures.

The TSVs 250 may include at least one metal. For example, the TSVs 250 may include a barrier metal layer (not shown) and a wiring metal layer (not shown). The barrier metal layer may be formed of one selected from titanium (Ti), tantalum (Ta), titanium nitride (TiN), and tantalum nitride (TaN), or may have a structure in which at least two selected therefrom are stacked. The wiring metal layer may include, for example, at least one selected from the group consisting of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium(Pd), platinum (Pt), rhodium (Rh), rhenium (Re), lutetium (Ru), tantalum (Ta), tellurium (Te), titanium (Ti), tungsten (W), zinc (Zn), and zirconium (Zr). For example, the wiring metal layer may be formed of one selected from tungsten (W), aluminum (Al), and copper (Cu), or may have a structure in which at least two selected therefrom are stacked. However, the material of the TSVs 250 is not limited thereto.

A spacer insulation layer (not shown) may be interposed between the TSVs 250 and the body portion 210. The spacer insulation layer may reduce or effectively prevent direct contact between the TSVs 250 and circuit elements within the body portion 210. The spacer insulation layer may not be formed on bottom surfaces of the TSVs 250.

When the internal substrate 200 is formed based on an active wafer, the internal substrate 200 may function as a memory device or a logic device. Examples of the memory device may include a DRAM, an SRAM, a flash memory, an EEPROM, a PRAM, an MRAM, and an RRAM.

The semiconductor chip 100 may include, similar to the internal substrate 200, a body portion 110, a passivation layer 120, chip pads 130, and connecting members 140.

The body portion 110 corresponds to the above-described body portion 210 of the internal substrate 200, and thus a detailed description thereof will be omitted. However, the body portion 110 of the semiconductor chip 100 may be formed based on an active wafer instead of an interposer substrate. The passivation layer 120, the chip pads 130, and the connecting members 140 respectively correspond to the passivation layer 220, the lower pads 230, and the connecting members 240 of the internal substrate 200, and thus detailed descriptions thereof also will be omitted.

According to example embodiments, the semiconductor chip 100 may not include TSVs and an upper pad, in contrast with the internal substrate 200. However, in some cases, the semiconductor chip 100 may include TSVs and an upper pad.

The semiconductor chip 100 may be a memory device or a logic device. As described above, examples of the memory device may include a DRAM, an SRAM, a flash memory, an EEPROM, a PRAM, an MRAM, and an RRAM.

Both the internal substrate 200 and the semiconductor chip 100 may be memory devices or logic devices. Alternatively, one of the internal substrate 200 and the semiconductor chip 100 may be a memory device, and the other may be a logic device. For example, the internal substrate 200 may be a logic device, and the semiconductor chip 100 may be a memory device.

The internal seal 300 seals the semiconductor chip 100. The internal seal 300 may have a Young's modulus of less than 1 GPa, for example, several tens to several hundreds of MPa. The internal seal 300 may be formed of, for example, a silicone-based material, a thermosetting material, a thermoplastic material, a UV curable material, or the like. A thermosetting material may include a phenol type, acid anhydride type, or amine type hardener and an acrylic polymer addition agent.

The internal seal 300 may be formed of resin with a relatively smaller amount of filler. Here, the terminology 'relatively smaller amount' denotes 'smaller amount compared with the amount of filler of the external seal 3000', and more precisely, denotes relatively smaller amount of filler per unit volume, e.g., the density of the filler. In more detail, when the internal seal 300 and the external seal 3000 are formed of the same resin, the Young's moduli of the internal and external seals 300 and 3000 may be adjusted according to the amount of filler contained in the resin. Thus, the Young's modulus of the internal seal 300 may be reduced by containing a relatively smaller amount of filler in the resin used to form the internal seal 300, and the Young's modulus of the external seal 3000 may be increased by containing a relatively large amount of filler in the resin used to form the external seal 3000. For reference, a Young's modulus represents an elastic coefficient, and thus, a material with a smaller Young's modulus may be relatively more flexible or softer and a material with a large Young's modulus may be relatively more solid or harder. The filler may be a silica filler.

The internal seal 300 may be formed through a molded (MUF) process. Accordingly, a material that covers the outside of the semiconductor chip 100 may be the same as a material with which a space between the semiconductor chip 100 and the internal substrate 200 is filled.

The internal seal 300 may be formed in a wafer-level molding process and have a relatively smaller Young's modulus as described above, and thus, the internal seal 300 may be easily handled in processes subsequent to the wafer-level molding process and minimize or reduce warpage. For example, when the wafer-level molding process is not performed, that is, when semiconductor chips are not sealed by an internal seal, a base wafer, e.g., an active wafer, an interposer wafer, or a carrier wafer, on which semiconductor chips are stacked, is too flexible to be handled in the subsequent processes. When semiconductor chips are sealed by a seal with a relatively larger Young's modulus, for example, epoxy, severe warpage may occur, and thus, the subsequent processes may not be appropriately performed. However, as in the example embodiment, when semiconductor chips are sealed by an internal seal having a relatively smaller Young's modulus on a wafer level, both a handling problem and a warpage problem may be addressed.

The external substrate 2000 is a support substrate on which the internal package 1000 is mounted as described above. The external substrate 2000 may include a body portion 2100, a lower protective layer 2200, a lower pad 2300, an external connecting member 2400, an upper protective layer 2500, and an upper pad 2600. The external substrate 2000 may be formed based on a ceramic substrate, a PCB, an organic substrate, an interposer substrate, or the like. In some cases, the external substrate 2000 may also be formed of an active wafer.

A multilayered or single-layer wiring pattern (not shown) may be formed within the body portion 2100, and the lower pad 2300 and the upper pad 2600 may be electrically connected to each other via the multilayered or single-layer wiring pattern. The lower protective layer 2200 and the upper protective layer 2500 protect the body portion 2100 and may be formed of, for example, a solder resist.

The lower pad 2300 may be formed on a lower surface of the body portion 2100 and may be electrically connected to the multilayered or single-layer wiring pattern within the body portion 2100 via the lower protective layer 2200. A material and/or a forming method of the lower pad 2300 is the same as that of the lower pad 230 of the internal substrate 200, as described above. The upper pad 2600 may be formed on an upper surface of the body portion 2100 and may be electrically connected to the multilayered or single-layer wiring pattern within the body portion 2100 via the upper protective layer 2500. A material and/or a forming method of the upper pad 2600 is the same as that of the upper pad 260 of the internal substrate 200, as described above.

The external connecting member 2400 may be formed on the lower pad 2300 and may function to mount the semiconductor package 10000 on a system substrate or a main board outside the semiconductor package 10000. A structure and/or material of the external connecting member 2400 may be the same as that of the connecting member 240 of the internal substrate 200, as described above. However, the size of the external connecting member 2400 may be greater than that of the connecting member 240 of the internal substrate 200 or the connecting member 140 of the semiconductor chip 100.

The external seal 3000 may seal a lateral surface and an upper surface of the internal package 1000. The external seal 3000 may have a Young's modulus of more than 1 GPa, for example, several to several tens of GPa. The external seal 3000 may be formed of, for example, an epoxy-based material, a thermosetting material, a thermoplastic material, a UV curable material, or the like. A thermosetting material may include a phenol type, acid anhydride type, or amine type hardener and an acrylic polymer addition agent.

The external seal 3000 may be formed of resin with a relatively large amount of filler. For example, the external seal 3000 may be formed of an epoxy-based material including about 80% of silica filler. As described above, when the internal seal 300 and the external seal 3000 are formed of the same resin, the Young's moduli of the internal and external seals 300 and 3000 may be adjusted according to the amount of filler contained in the resin, e.g., the density of the filler. Thus, the Young's modulus of the internal seal 300 may be reduced by containing a relatively smaller amount of filler in the resin used to form the internal seal 300, and the Young's modulus of the external seal 3000 may be increased by containing a relatively larger amount of filler in the resin used to form the external seal 3000.

The external seal 3000 may also be formed by an MUF process, and thus, a material that covers the outside of the internal package 1000 may be the same as a material with which a space between the internal package 1000 and the external substrate 2000 is filled.

The semiconductor package 10000 according to the present example embodiment may address the aforementioned handling problem and/or warpage problem generated during a packaging process, by forming an internal seal of an internal package and an external seal outside the internal package of materials having different Young's moduli. In other words, the internal seal is formed of a material with a smaller Young's modulus and the external seal is formed of a material with a larger Young's modulus in the packaging process, whereby stress applied to an internal substrate may be reduced and the internal package may be maintained firm. Accordingly, the above-described problems may be efficiently addressed.

Semiconductor packages according to various example embodiments of the present inventive concepts, which have different structures from the semiconductor package 10000 of FIG. 1, will now be described. For convenience of explanation, matters described above with reference to FIG. 1 will be omitted or briefly described.

Figure 2:
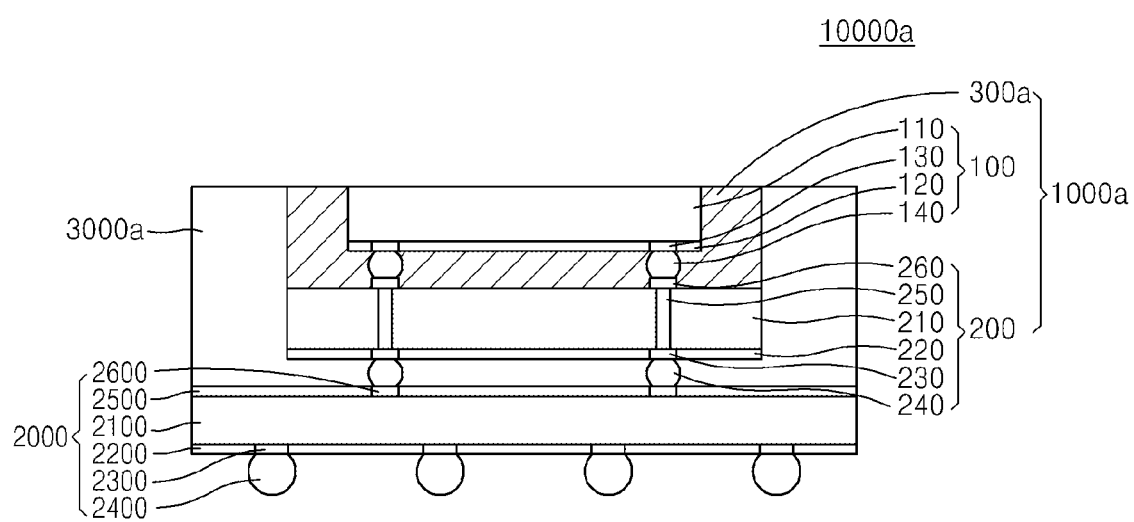

A semiconductor package 10000a according to an example embodiment of FIG. 2 may have substantially the same structure as the semiconductor package 10000 of FIG. 1 except for an internal seal and an external seal.

Referring to FIG. 2, in the semiconductor package 10000a, an internal seal 300a may not seal the upper surface of the semiconductor chip 100. Accordingly, the upper surface of the semiconductor chip 100 may be exposed from the internal seal 300a. An upper surface of the internal seal 300a may be on the same plane as the upper surface of the semiconductor chip 100.

An external seal 3000a may not seal an upper surface of an internal package 1000a. In other words, the upper surfaces of the semiconductor chip 100 and the internal seal 300a of the internal package 1000a may be exposed. Accordingly, the upper surfaces of the semiconductor chip 100, the internal seal 300a, and the external seal 3000a may all be on the same plane.

As also described above, in the semiconductor package 10000a according to the present example embodiment, the Young's modulus of the internal seal 300a is smaller than that of the external seal 3000a.

According to the example embodiment, the internal seal 300a and the external seal 3000a are formed so that the upper surfaces of the semiconductor chip 100, the internal seal 300a, and the external seal 3000a are on the same plane. However, the internal seal 300a and the external seal 3000a may be formed so that the upper surfaces of only two of the semiconductor chip 100, the internal seal 300a, and the external seal 3000a are on the same plane. For example, the internal seal 300a may be formed so that the upper surface of the semiconductor chip 100 is on the same plane with the upper surface of the internal seal 300a, and the external seal 3000a may be formed to cover the upper surface of the semiconductor chip 100 and the upper surface of the internal seal 300a. Alternatively, the internal seal 300a may be formed to cover the upper surface of the semiconductor chip 100, and the external seal 3000a may be formed to expose the upper surface of the internal seal 300a, for example, so that the upper surfaces of the external seal 3000a and the internal seal 300a are on the same plane.

Figure 3:
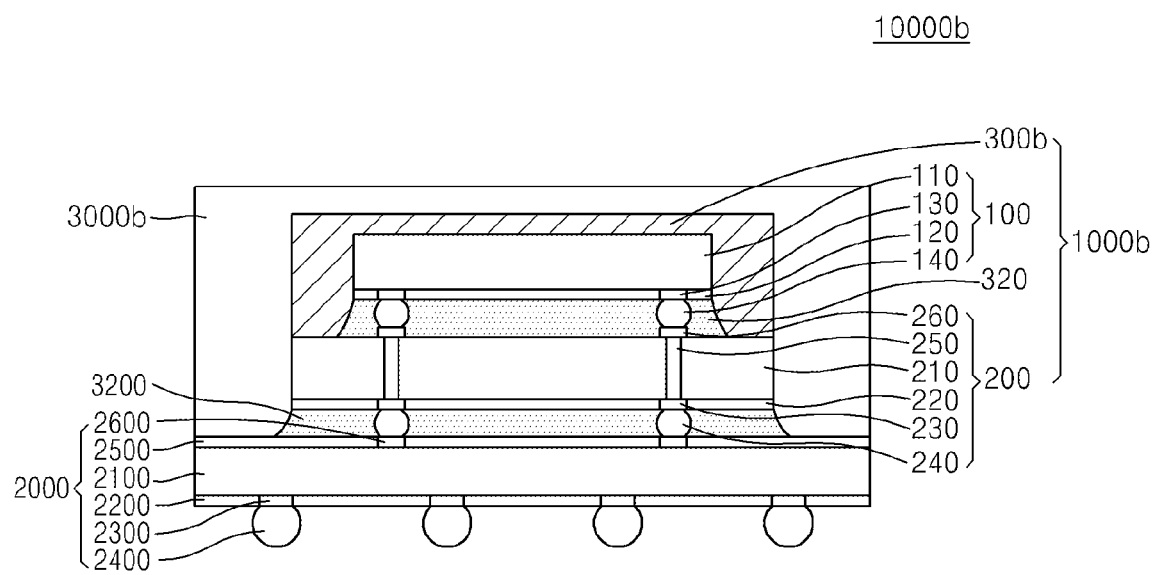

A semiconductor package 10000b according to the embodiment of FIG. 3 may substantially have the same structure as the semiconductor package 10000 of FIG. 1 except for a portion between a semiconductor chip and an internal substrate and a portion between an internal package and an external substrate.

Referring to FIG. 3, in the semiconductor package 10000b, an internal package 1000b may include an underfill 320 between the semiconductor chip 100 and the internal substrate 200. The underfill 320 may be filled in a connecting portion between the semiconductor chip 100 and the internal substrate 200, e.g., a portion where the connecting members 140 of the semiconductor chip 100 is connected to the upper pads 260 of the internal substrate 200. The underfill 320 may be formed of an underfill resin, for example, an epoxy resin, and a silica filler, a flux, or the like may be included in the underfill resin. The underfill 320 may be formed of a material different from that of the internal seal 300b, which is formed on the outside of the semiconductor chip 100. However, the underfill 320 may be formed of the same material as that of the internal seal 300b.

An adhesion member may be used instead of the underfill 320. The adhesion member may be, for example, a non-conductive film (NCF), an anisotropic conductive film (ACF), a UV film, an instant adhesive, a thermosetting adhesive, a laser hardening adhesive, an ultrasonic hardening adhesive, or a non-conductive paste (NCP).

The internal seal 300b has a structure slightly different from that of the internal seal 300 described above with reference to FIG. 1. In other words, the internal seal 300b may seal the lateral surface and the upper surface of the semiconductor chip 100 and a lateral surface of the underfill 320. The material of the internal seal 300b may be the same as that of the internal seal 300 described above with reference to FIG. 1. Accordingly, a detailed description of the internal seal 300b will be omitted.

The semiconductor package 10000b according to the present example embodiment may further include an external underfill 3200 that fills a space between the internal package 1000b and the external substrate 2000. The material of the external underfill 3200 may be the same as that of the above-described underfill 320 in the internal package 1000b.

Due to the external underfill 3200, the external seal 3000b may seal a lateral surface and an upper surface of the internal package 1000b and a lateral surface of the external underfill 3200. The material of the external seal 3000b may be the same as that of the external seal 3000 described above with reference to FIG. 1. Accordingly, a detailed description of the external seal 3000b will be omitted.

Figure 4:
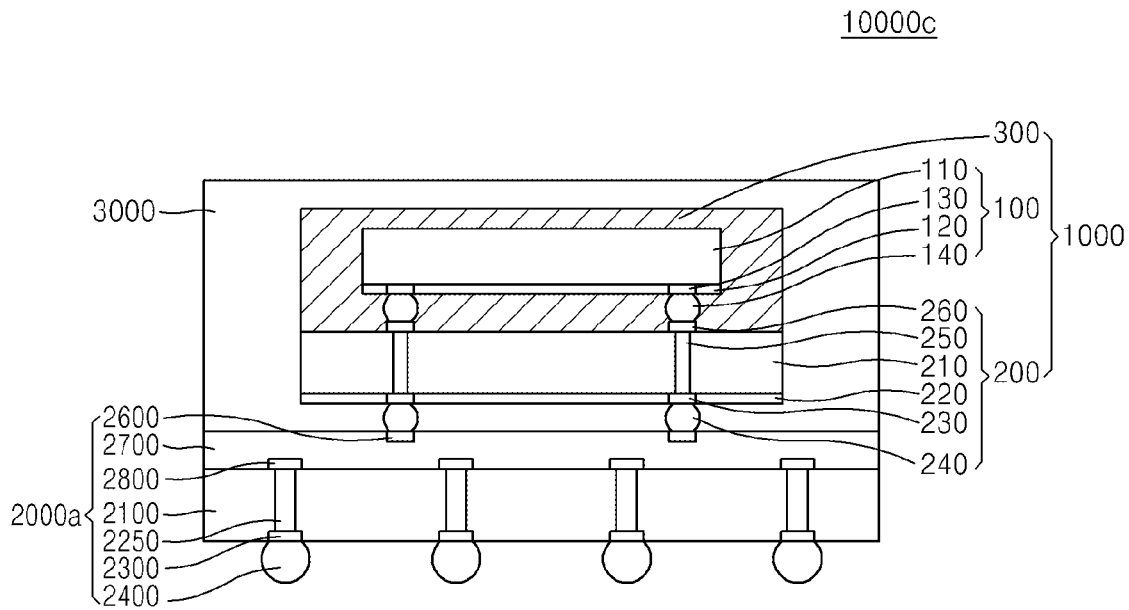

A semiconductor package 10000c according to an example embodiment of FIG. 4 may substantially have the same structure as the semiconductor package 10000 of FIG. 1 except for an external substrate.

Referring to FIG. 4, in the semiconductor package 10000c, an external substrate 2000a may include a body portion 2100, via contacts 2250, lower pads 2300, external connecting members 2400, upper pads 2600, a wiring layer 2700, and via pads 2800. The external substrate 2000a may serve as a medium that enables the internal package 1000, which becomes finer, to be mounted on an external system substrate or an external main board.

The body portion 2100 simply serves as a support substrate and may be formed of, for example, glass, ceramic, an organic material, or plastic. The via contacts 2250 are formed passing through the body portion 2100, and ends of each of the via contacts 2250 may be respectively connected to the lower pads 2300 and the via pads 2800. Although the material and structure of the via contacts 2250 are similar to those of the TSVs 250 formed in the internal substrate 200, the via contacts 2250 are simply referred to as via contacts because the body portion 2100 is not necessarily formed of silicon.

The wiring layer 2700 may be formed on the body portion 2100 and may electrically connect the via pads 2800 to the upper pads 2600 by including a single-layer or multi-layered wiring pattern (not shown). In some cases, the wiring layer 2700 may not be included, and thus, the via contacts 2250 may be directly connected to the upper pads 2600.

The external connecting members 2400, for example, bumps or solder balls, may be formed on the lower pads 2300.

The semiconductor package 10000c may be mounted on an external device via the external connecting members 2400. The connecting members 240 of the internal substrate 200 may be connected to the upper pads 2600, and thus, the internal package 1000 may be mounted on the external substrate 2000a.

Figure 5A:
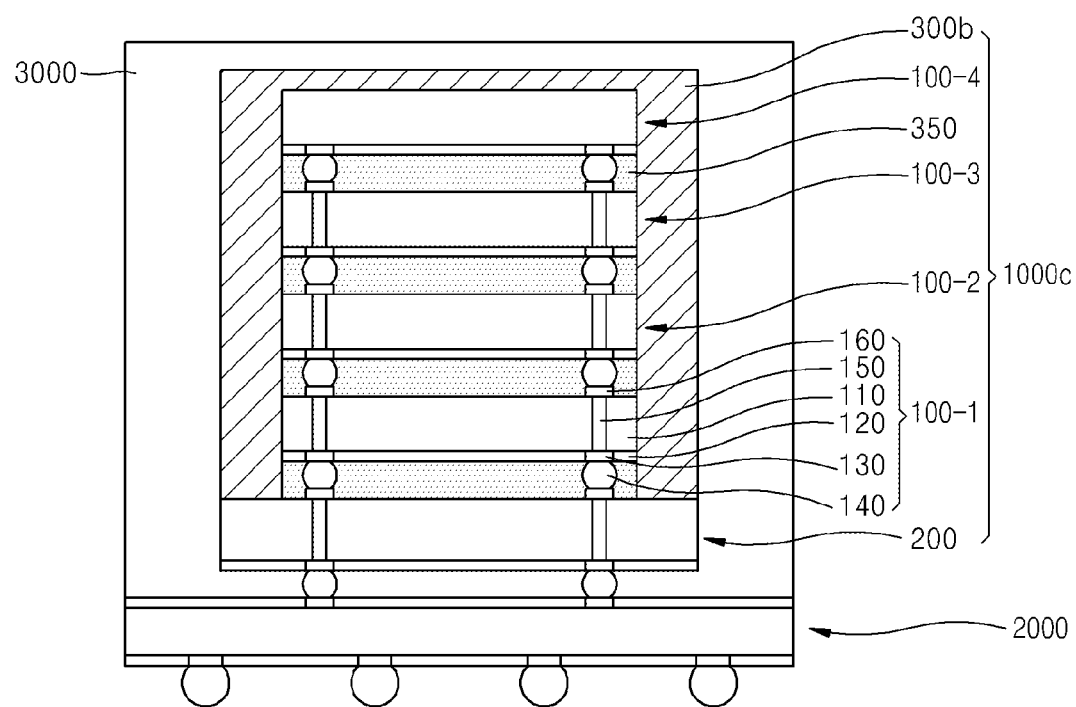
Figure 5B:
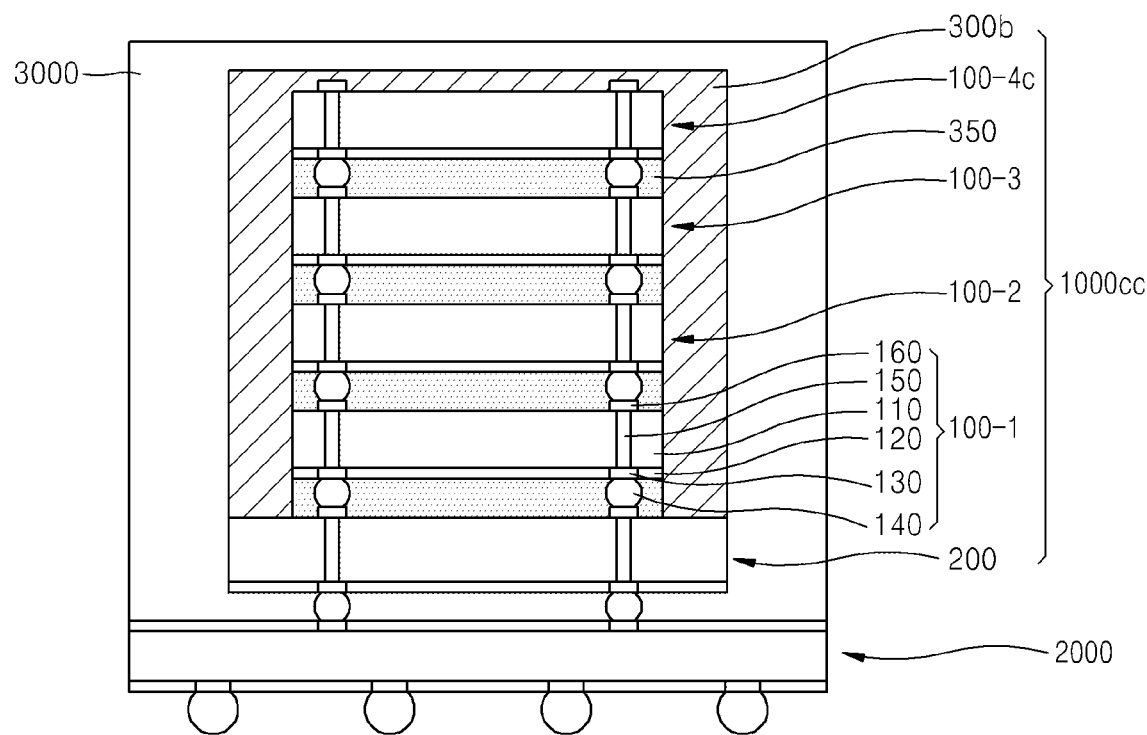

Semiconductor packages 10000d and 1000dd according to example embodiments of FIG. 5A and 5B may substantially have the same structures as the semiconductor package 10000 of FIG. 1 except for the number of semiconductor chips included in an internal package.

Referring to FIGS. 5A and 5B, in the semiconductor package 10000d or 10000dd, an internal package 1000c or 1000cc may include four (4) semiconductor chips, namely, first, second, third, and fourth semiconductor chips 100-1, 100-2, 100-3, and 100-4 or 100-4c, stacked on the internal substrate 200. Each of the first through third semiconductor chips 100-1, 100-2, and 100-3 may include TSVs 150 and upper pads 160 in contrast with the semiconductor chip 100 of FIG. 1. All of the first, second, third, and fourth semiconductor chips 100-1, 100-2, 100-3, and 100-4 or 100-4c may be electrically connected to one another via the chip pads 130 and the connecting members 140 of each of the first, second, third, and fourth semiconductor chips 100-1, 100-2, 100-3, and 100-4 or 100-4c and the TSVs 150 and the upper pads 160 of the first through third semiconductor chips 100-1, 100-2, and 100-3. Although the fourth semiconductor chip 100-4 does not include TSVs 150 and upper pads 160, as shown in FIG. 5A, the fourth semiconductor chip 100-4c may include a TSV 150 and an upper pads 160, as shown in FIG. 5B.

The four (4) semiconductor chips, namely, the first, second, third, and fourth semiconductor chips 100-1, 100-2, 100-3, and 100-4 or 100-4c, may all be semiconductor chips of the same kind, or at least some of the 4 semiconductor chips, namely, the first, second, third, and fourth semiconductor chips 100-1, 100-2, 100-3, and 100-4 or 100-4c, may be semiconductor chips of different kinds. For example, all of the 4 semiconductor chips, namely, the first, second, third, and fourth semiconductor chips 100-1, 100-2, 100-3, and 100-4 or 100-4c, may be memory devices, or only some of the 4 semiconductor chips, namely, the first, second, third, and fourth semiconductor chips 100-1, 100-2, 100-3, and 100-4 or 100-4c, may be memory devices and the others may be logic devices. When all of the 4 semiconductor chips, namely, the first, second, third, and fourth semiconductor chips 100-1, 100-2, 100-3, and 100-4 or 100-4c, are memory devices, the memory devices may be of different types in certain cases.

Semiconductor chips may be stacked by interposing an adhesion member 350 between every adjacent semiconductor chips. The adhesion member 350 may be, for example, an NCF, an ACF, a UV film, an instant adhesive, a thermosetting adhesive, a laser hardening adhesive, an ultrasonic hardening adhesive, or an NCP.

The NCF is a common adhesive film and has an insulation property. When the NCF is used, an upper semiconductor chip may be stacked on a lower semiconductor chip by compression. The use of the NCF may reduce or effectively prevent warpage or bending, for example, twisting of chips caused by conventionally stacking chips through heat and compression, and thus, may be suitable to stack a plurality of layers.

The ACF, which is an anisotropic conductive film, may have a structure in which conductive particles are distributed within an insulative adhesion film, and may have an anisotropic electrical characteristic that, when pads are connected via the ACF, a current flows only in an electrode direction, .e.g., in a vertical direction, and a current does not flow in a direction between electrodes, e.g., a horizontal direction. When the ACF is fused by heat and compression, the conductive particles are arranged between facing electrodes to thereby provide conductivity, whereas spaces between adjacent electrodes are filled with the insulative adhesive film, and thus are insulated from each other.

The material of the adhesion member 350 is not limited to the above-described materials, and the adhesion member 350 may be formed of any of various other adhesive materials capable of firmly adhering the semiconductor chips to one another and sealing connecting members and pads in their connecting portions. In some cases, an underfill material may be used instead of the adhesion member 350.

According to the example embodiment, four (4) semiconductor chips, namely, the first, second, third, and fourth semiconductor chips 100-1, 100-2, 100-3, and 100-4 or 100-4c, are stacked on the internal substrate 200. However, these are only examples. Accordingly, less than four (4) semiconductor chips or more than 4 semiconductor chips may be stacked on the internal substrate 200. As the number of stacked semiconductor chips increases, wafer-level molding may become more important. In other words, as the number of stacked semiconductor chips increases, if molding is not performed, performing subsequent processes becomes more difficult. Even when molding is performed, if semiconductor chips are sealed with a seal having a larger Young's modulus, for example, an epoxy, warpage may occur. However, according to the present example embodiments, semiconductor chips are sealed with an internal seal having a relatively smaller Young's modulus, for example, a silicone-based internal seal, and thus, the above problems may be addressed.

Figure 6:
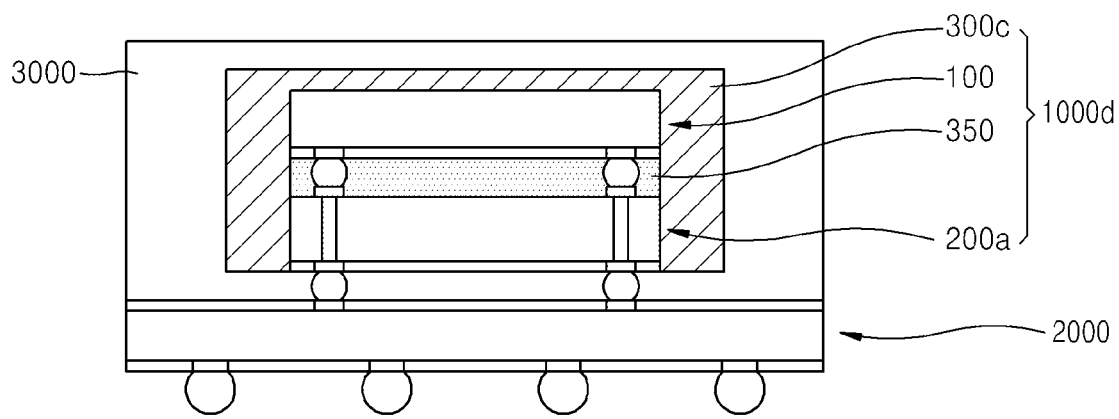

A semiconductor package 10000e according to an example embodiment of FIG. 6 may substantially have the same structure as the semiconductor package 10000 of FIG. 1 except for the size of an internal substrate and the structure of an internal seal.

Referring to FIG. 6, in the semiconductor package 10000e, an internal substrate 200a may have the same size, namely, the same plane area, as the semiconductor chip 100. An internal seal 300c may seal a lateral surface of the internal substrate 200a. Accordingly, the lateral surface of the internal substrate 200a may not be exposed from the internal seal 300c.

The semiconductor chip 100 may be stacked on the internal substrate 200a via the adhesion member 350. Accordingly, a space between the semiconductor chip 100 and the internal substrate 200a may not be filled with the internal seal 300c. For example, an underfill material may be used instead of the adhesion member 350.

According to the structure of an internal package 1000d included in the semiconductor package 10000e of the example embodiment, the lateral surface of the internal substrate 200a formed based on an active wafer is not exposed, and thus, may be protected from external physical, chemical damage during a packaging process. Formation of the structure of the internal package 1000d may be understood with reference to a semiconductor package manufacturing method illustrated in FIGS. 16A through 16E.

Figure 7:
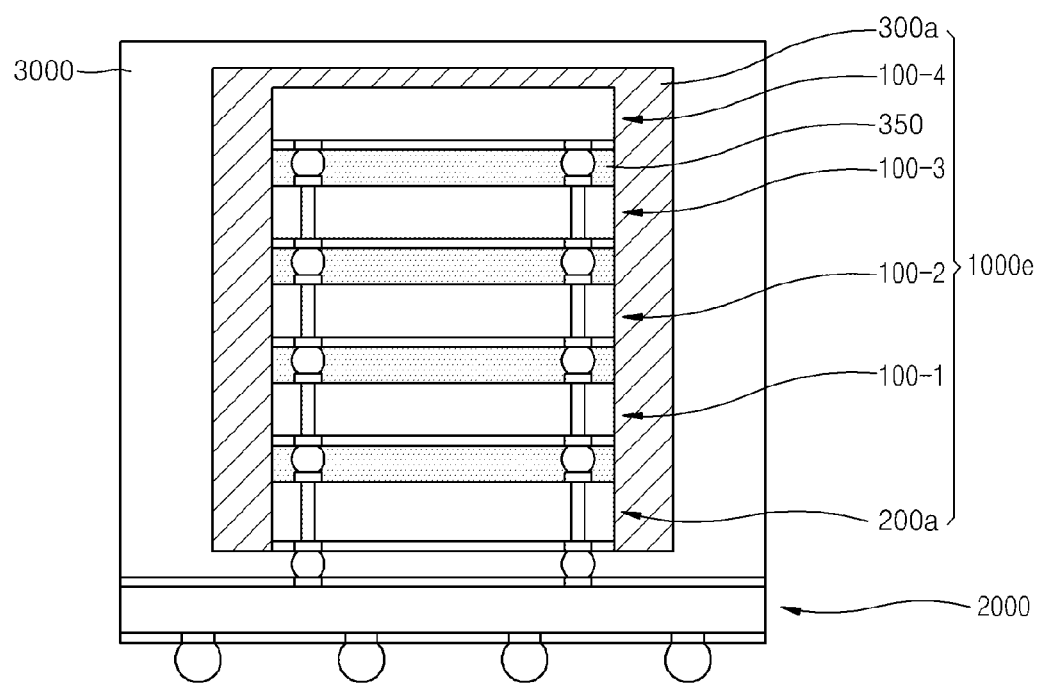

A semiconductor package 10000f according to an embodiment of FIG. 7 may substantially have the same structure as the semiconductor package 10000d of FIG. 5A except for the size of an internal substrate and the structure of an internal seal.

Referring to FIG. 7, in the semiconductor package 10000f, an internal package 1000e may include four (4) semiconductor chips, namely, the first, second, third, and fourth semiconductor chips 100-1, 100-2, 100-3, and 100-4, stacked on an internal substrate 200a, similar to the internal package 1000c of FIG. 5A. However, like the internal package 1000d of FIG. 6, the size, namely, the plane area, of the internal substrate 200a may be the same as that of the semiconductor chip.

A semiconductor package 10000g according to the embodiment of FIG. 8 may substantially have the same structure as the semiconductor package 10000 of FIG. 1 except for the number of stacked semiconductor chips and a stacked structure.

Referring to FIG. 8, in the semiconductor package 10000g, an internal package 1000f may include two semiconductor chips 100 and 400 spaced apart from each other in a horizontal direction.

In this structure, one of the two semiconductor chips 100 and 400 may be a memory device, and the other may be a logic device. Although one semiconductor chip is illustrated on each side in FIG. 8, at least two semiconductor chips may be stacked on one side. For example, when the semiconductor chip 100 on the right side is a memory device and the semiconductor chip 400 on the left side is a logic chip, a plurality of memory semiconductor chips 100 may be stacked on the right side as illustrated in FIG. 5A or 7. In this case, the internal substrate 200 may be an interposer substrate to simply serve as a medium. Alternatively, the internal substrate 200 may serve as a logic device, and both the semiconductor chips 100 and 400 on both sides may serve as memory devices.

Although the 2 semiconductor chips 100 and 400 are spaced apart from each other on the internal substrate 200 in the semiconductor package 10000g according to the example embodiment, the inventive concepts are not limited thereto. In other words, at least three (3) semiconductor chips may be arranged horizontally spaced apart from each other on the internal substrate 200.

A semiconductor package 10000h according to an embodiment of FIG. 9 may substantially have the same structure as the semiconductor package 10000g of FIG. 8 except that the semiconductor package 10000h further includes a passive element.

Referring to FIG. 9, in the semiconductor package 10000h, an internal package 1000g may further include a passive element 500 stacked on the internal substrate 200. The passive element 500 may be a resistor, a capacitor, an inductor, or the like. As such, the semiconductor package 10000h according to the example embodiment may include an internal package 1000g disposing the passive element 500 on the internal substrate 200 and sealing the semiconductor chips 100 and 400 together with the passive element 500 by using an internal seal 300.

Although the two (2) semiconductor chips 100 and 400 are horizontally spaced apart from each other in the example embodiment, the inventive concepts are not limited thereto. For example, one semiconductor chip and one passive element may be arranged on the internal substrate 200, or a plurality of semiconductor chips vertically stacked as in FIG. 5A or 7 and a passive element may be disposed apart from each other on the internal substrate 200.

Figure 10:
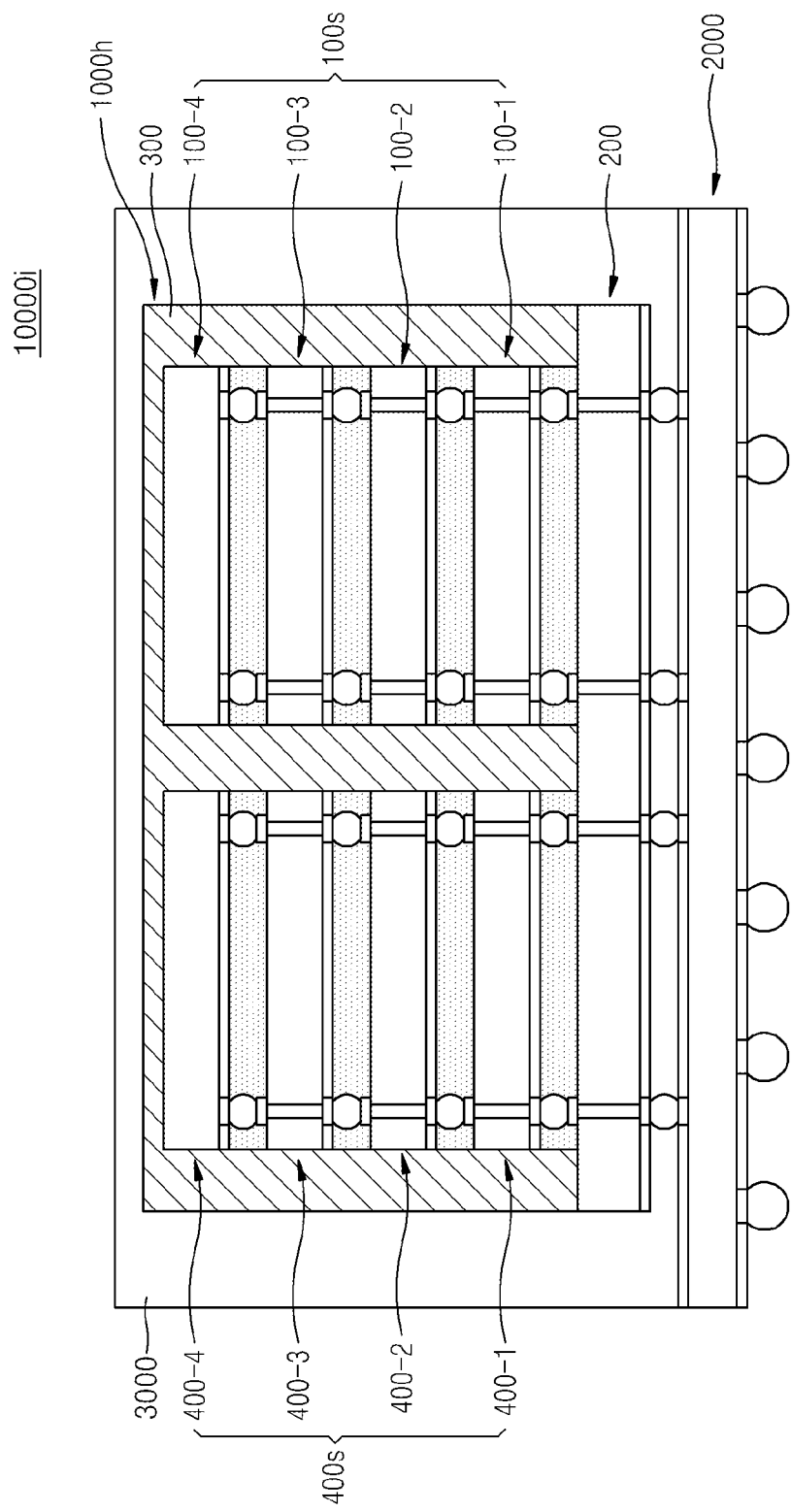

A semiconductor package 10000i according to an example embodiment of FIG. 10 may substantially have the same structure as the semiconductor package 10000g of FIG. 8 except for the number of stacked chip portions formed on an internal substrate.

Referring to FIG. 10, in the semiconductor package 10000i, an internal package 1000h may include two stacked chip portions 100s and 400s which are horizontally spaced apart from each other on the internal substrate 200 and in each of which a plurality of semiconductor chips are stacked. Each of the stacked chip portions 100s and 400s may be a stack of four (4) semiconductor chips and may have the same structure as the structure of FIG. 5A in which the four (4) semiconductor chips, namely, the first, second, third, and fourth semiconductor chips 100-1, 100-2, 100-3, and 100-4, are stacked.

In the semiconductor package 10000i having this structure, the internal substrate 200 may function as a logic device, and the semiconductor chips of both the stacked chip portions 100s and 400s may all be memory devices.

Although each of the stacked chip portions 100s and 400s includes four (4) semiconductor chips in the example embodiment, the inventive concepts are not limited thereto. For example, each of the stacked chip portions 100s and 400s may include less than four (4) or more than four (4) semiconductor chips. In some cases, the stacked chip portion 100s and the stacked chip portion 400s may have different numbers of semiconductor chips.

Figure 11:
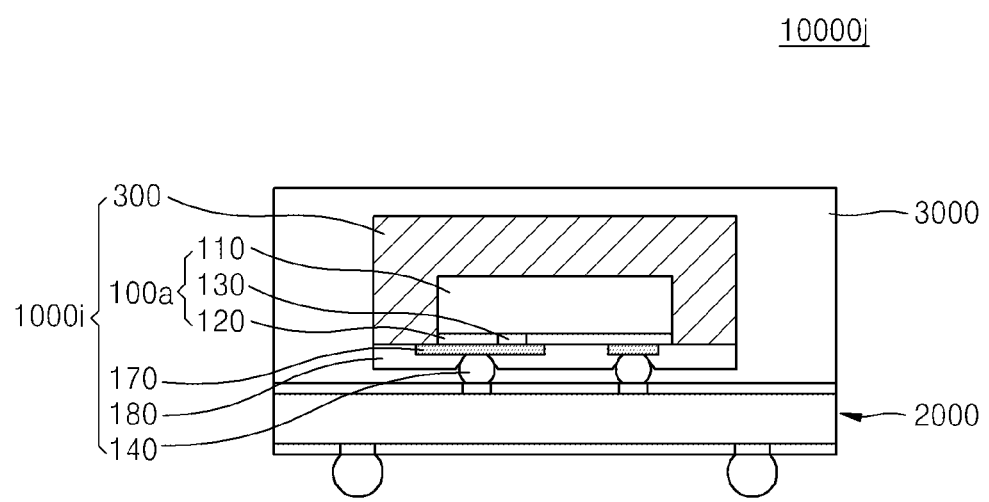

A semiconductor package 10000j according to an example embodiment of FIG. 11 includes an internal package having a different structure from the internal packages of the semiconductor packages of FIGS. 1 through 10.

Referring to FIG. 11, in the semiconductor package 10000j, an internal package 1000i is a wafer-level package including no internal substrates, and may include a semiconductor chip 100a, a redistribution line 170, a protective layer 180, connecting members 140, and an internal seal 300. The semiconductor chip 100a is described as excluding the connecting members 140 because of a relationship between the locations of the semiconductor chip 100a and the connecting members 140. Accordingly, the semiconductor chip 100a may include a body portion 110, a passivation layer 120, and chip pads 130.

The redistribution line 170 may be formed on the passivation layer 120 and the chip pads 130 and may be electrically connected to the chip pads 130. The redistribution line 170 may be formed only on a lower surface of the semiconductor chip 100a, or may extend from a desirable (or alternatively, predetermined) portion of the lower surface of the semiconductor chip 100a to a desirable (or alternatively, predetermined) lower surface of the internal seal 300. Depending on the degree to which the redistribution line 170 extends, a location of the connecting members 140 disposed below the redistribution line 170 may vary. For example, the connecting member 140 may be disposed within a space below the lower surface of the semiconductor chip 100a or may be disposed outside the space.

For ease of reference, a structure in which the connecting members 140 are formed within the space below the lower surface of the semiconductor chip 100a will be referred to as a fan-in structure, and a structure in which the connecting members 140 are formed outside the space below the lower surface of the semiconductor chip 100a will be referred to as a fan-out structure. Presently, the fan-out structure is the JEDEC standard for packages without PCBs. The present example embodiment illustrates a fan-in structure because the connecting member 140 is located within the space below the lower surface of the semiconductor chip 100a.

The redistribution line 170 may be formed of a conductive material, for example, a metal such as silver (Ag), aluminum (Al), copper (Cu), gold (Au), nickel (Ni), or palladium (Pd) by using a lithography method or a printing method. Examples of the printing method may include an imprinting method, e.g., roll-to-roll printing or screen printing. The redistribution line 170 may be formed as multiple layers or a single layer.

The protective layer 180 may be formed on the semiconductor chip 100a, the redistribution line 170, and the internal seal 300, and protect the semiconductor chip 100a and the redistribution line 170 from external physical, chemical damage. The protective layer 180 may include an opening through which a part of the redistribution line 170 is exposed. The protective layer 180 may be formed of, for example, a solder resist, and may have a thickness of about 5 to about 20 μm through imprinting.

The connecting members 140 may be disposed in the opening formed in the protective layer 180 so as to be electrically connected to the redistribution line 170. A material or a forming method of the connecting members 140 is the same as that of the connecting members 240 of the internal substrate 200 of FIG. 1.

The internal seal 300 may seal the semiconductor chip 100a. The internal seal 300 may be the same as the internal seal 300 described above with reference to FIG. 1. However, in the example embodiment, because the internal package 1000i includes no internal substrates, the internal seal 300 may be formed on a lateral surface and an upper surface of the semiconductor chip 100a and on the protective layer 180.

Figure 12:
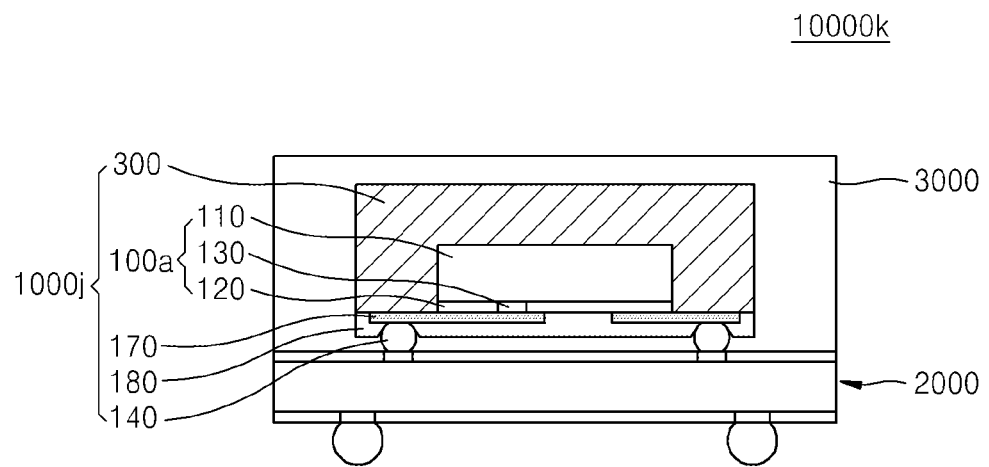

A semiconductor package 10000k according to an example embodiment of FIG. 12 may substantially have the same structure as the semiconductor package 10000j of FIG. 11 except that an internal package has a fan-out structure.

Referring to FIG. 12, in the semiconductor package 10000k, an internal package 1000j may have a fan-out structure. In other words, a redistribution line 170 may extend further from the semiconductor chip 100a than the redistribution line 170 of FIG. 11. An opening of a protective layer 180 may be formed in a portion outside the space below the lower surface of the semiconductor chip 100a so that a part of the redistribution line 170 is exposed. Accordingly, the connecting members 140 may be connected to the redistribution line 170 via the opening formed at the location outside the space below the lower surface of the semiconductor chip 100a.

Figure 13:
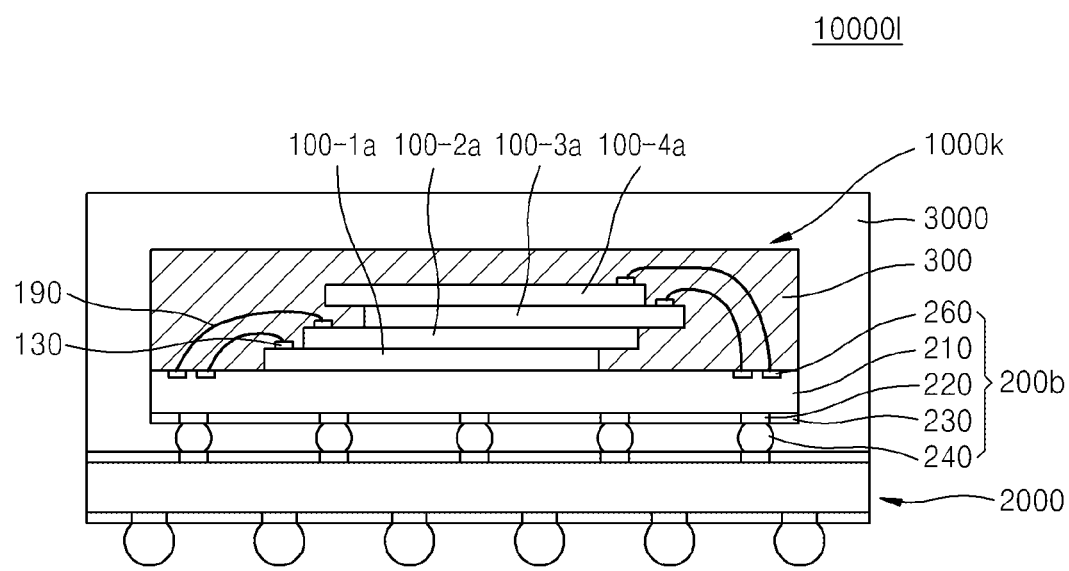

A semiconductor package 100001 according to an example embodiment of FIG. 13 may substantially have the same structure as the semiconductor package 10000d of FIG. 5A except for a stacking structure and a bonding structure of semiconductor chips within an internal package.

Referring to FIG. 13, in the semiconductor package 100001, an internal package 1000k may include four (4) semiconductor chips, namely, the first, second, third, and fourth semiconductor chips 100-1a, 100-2a, 100-3a, and 100-4a, stacked on an internal substrate 200b and having a cascade type offset structure. An offset direction of the first and second semiconductor chips 100-1a and 100-2a may be opposite to that of the third and fourth semiconductor chips 100-3a and 100-4a. Due to this offset arrangement, chip pads 130 of the four (4) semiconductor chips, namely, the first, second, third, and fourth semiconductor chips 100-1a, 100-2a, 100-3a, and 100-4a, may be exposed. The four (4) semiconductor chips, namely, the first, second, third, and fourth semiconductor chips 100-1a, 100-2a, 100-3a, and 100-4a, may be electrically connected to the internal substrate 200b by connecting the exposed chip pads 130 to upper pads 260 of the internal substrate 200b via connecting wires 190 respectively.

Because the first, second, third, and fourth semiconductor chips 100-1a, 100-2a, 100-3a, and 100-4a are connected to the internal substrate 200b via a wire bonding method, the upper pads 260 of the internal substrate 200b may be located in an edge portion of the internal substrate 200b where no semiconductor chips are arranged, as illustrated in FIG. 13.

In the semiconductor package 100001 according to the present example embodiment, the stacking structure of the four (4) semiconductor chips, namely, the first, second, third, and fourth semiconductor chips 100-1a, 100-2a, 100-3a, and 100-4a, is not limited to the cascade type offset structure. For example, the four (4) semiconductor chips, namely, the first, second, third, and fourth semiconductor chips 100-1a, 100-2a, 100-3a, and 100-4a, may be stacked in a zigzag manner. The number of semiconductor chips stacked is not limited to four (4), and less than or more than four (4) semiconductor chips may be stacked.

Figure 14:
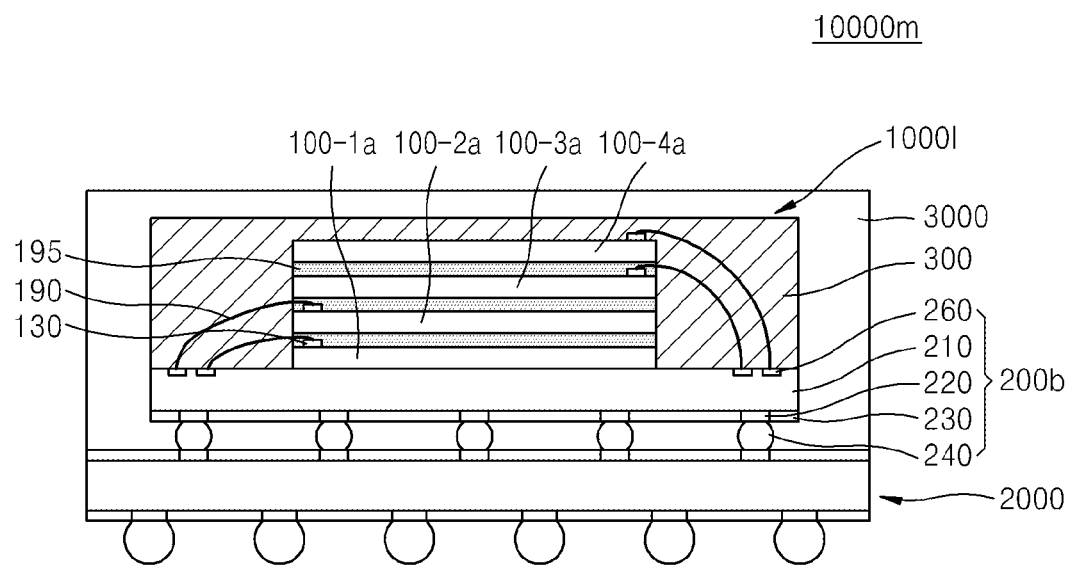

A semiconductor package 10000m according to an example embodiment of FIG. 14 may substantially have the same structure as the semiconductor package 100001 of FIG. 13 except for a stacking structure of semiconductor chips within an internal package.

Referring to FIG. 14, in the semiconductor package 10000m, four (4) semiconductor chips, namely, the first, second, third, and fourth semiconductor chips 100-1a, 100-2a, 100-3a, and 100-4a, may be stacked with an adhesion layer or an underfill 195 between every two adjacent semiconductor chips, namely, the first, second, third, and fourth semiconductor chips 100-1a, 100-2a, 100-3a, and 100-4a. Accordingly, the four (4) semiconductor chips, namely, the first, second, third, and fourth semiconductor chips 100-1a, 100-2a, 100-3a, and 100-4a, may be stacked so that lateral surfaces of the first, second, third, and fourth semiconductor chips 100-1a, 100-2a, 100-3a, and 100-4a are on the same plane, without being stacked offset.

The adhesion layer or the underfill 195 may have a desirable (or alternatively, predetermined) thickness, and thus, a space between adjacent semiconductor chips is secured. Thus, the chip pads 130 of the semiconductor chips may be connected to the corresponding upper pads 260 of the internal substrate 200b via the connecting wires 190.

Semiconductor packages according to several example embodiments of the inventive concepts have been described above. However, the inventive concepts are not limited to these embodiments. For example, matters described above with reference to the embodiments above may apply to other embodiments without destroying major features of the other embodiments. As long as the technical spirit in which an internal seal and an external seal are formed of materials having different Young's moduli is employed, for example, the internal seal is formed of a small Young's modulus material and the external seal is formed of a large Young's modulus material, any type of package may be included in the inventive concepts.

FIGS. 15A through 15J are sectional views illustrating a method of manufacturing the semiconductor package 10000d of FIG. 5A, according to an example embodiment of the inventive concepts. Like reference numerals refer to like components of the semiconductor chips in the semiconductor package 10000d of FIG. 5A.

Referring to FIG. 15A, a base wafer 200W in which the plurality of TSVs 250 are formed may be prepared. The base wafer 200W may be prepared by being adhered onto a carrier substrate 4000 via an adhesion member 4200.

The carrier substrate 4000 may be formed of, for example, a silicon, germanium, silicon-germanium, gallium-arsenic (GaAs), glass, plastic, or ceramic substrate. The adhesion member 4200 may be, for example, an NCF, an ACF, an instant adhesive, a thermosetting adhesive, a laser hardening adhesive, an ultrasonic hardening adhesive, or an NCP. As illustrated in FIG. 15A, the base wafer 200W may be adhered to the carrier substrate 4000 so that the connecting member 240 faces the carrier substrate 4000.

The base wafer 200W may be a wafer in which the plurality of TSVs 250 are formed on a wafer level. The base wafer 200W may be formed based on an active wafer or an interposer substrate. When the base wafer 200W is formed based on an active wafer, the base wafer 200W may include a plurality of semiconductor chips, and the semiconductor chips may each include the TSVs 250.

Figure 15B:
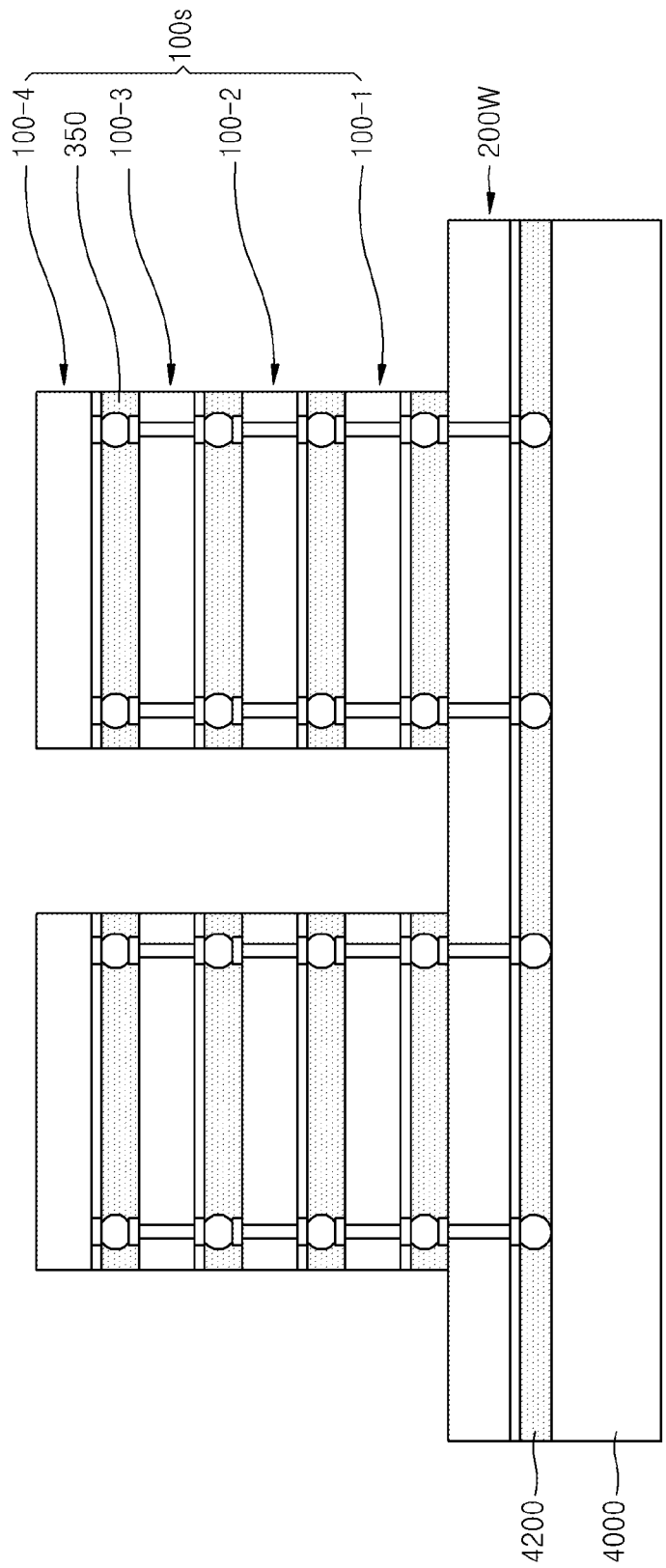

Referring to FIG. 15B, a plurality of stacked chip portion 100s may be formed by stacking a desirable (or alternatively predetermined) number of semiconductor chips on the base wafer 200W. Although four (4) semiconductor chips, namely, the first, second, third, and fourth semiconductor chips 100-1, 100-2, 100-3, and 100-4, are stacked in each chip portion 100s according to the present example embodiment, the number of stacked semiconductor chips is not limited to four (4), as described above. The stacking of the semiconductor chips may be sequentially performed in a manner where a connecting member of an upper semiconductor chip may be adhered to an upper pad of a lower semiconductor chip by thermal compression. Alternatively, the semiconductor chips may be stacked by filling spaces between the semiconductor chips with the adhesion members 350.

The adhesion member 350 may be, for example, an NCF, an ACF, a UV film, an instant adhesive, a thermosetting adhesive, a laser hardening adhesive, an ultrasonic hardening adhesive, or an NCP, as described above. An underfill resin may be used instead of the adhesion member 350. When the first semiconductor chip 100-1 is adhered to the base wafer 200W, an underfill resin may be used.

Figure 15C:
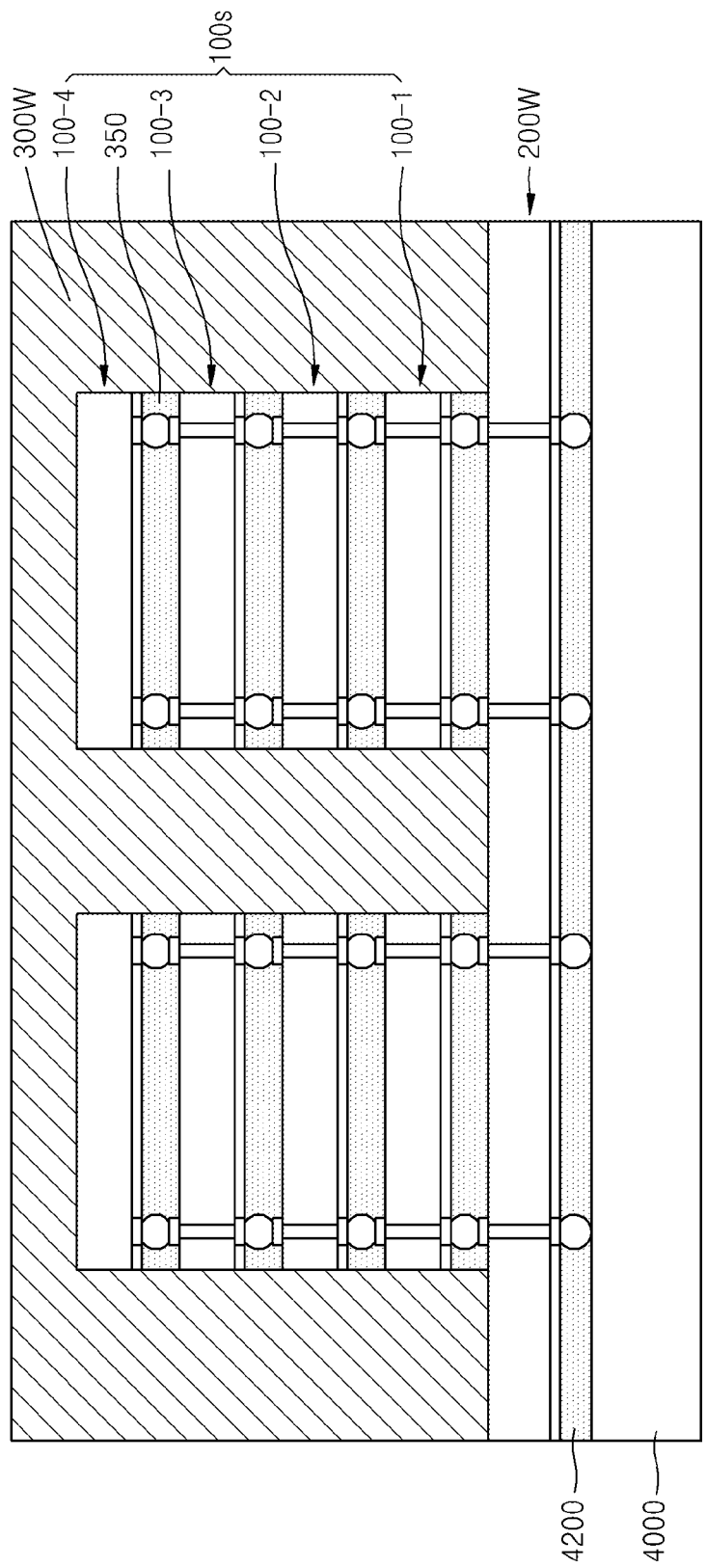

Referring to FIG. 15C, the stacked chip portions 100s may be sealed by an internal seal 300W. The internal seal 300W is formed of a material with a relatively smaller Young's modulus. For example, the internal seal 300W may have a Young's modulus of several tens to several hundreds of MPa. The internal seal 300W may be formed of, for example, a silicone-based material, a thermosetting material, a thermoplastic material, a UV curable material, or the like. The thermosetting material may include a phenol type, acid anhydride type, or amine type hardener and an acrylic polymer addition agent. When the internal seal 300W is formed of resin, the resin may contain a relatively smaller amount of filler.

Referring to FIG. 15D, the thickness of the internal seal 300W may be reduced by grinding an upper surface of the internal seal 300W. In some cases, to form a similar structure to the semiconductor package 10000a of FIG. 2, grinding may be performed to expose upper surfaces of the uppermost semiconductor chips, e.g., the fourth semiconductor chips 100-4, of the stacked chip portions 100s. This grinding, which is performed to make a thin semiconductor package, may not be performed in some cases.

Figure 15E:
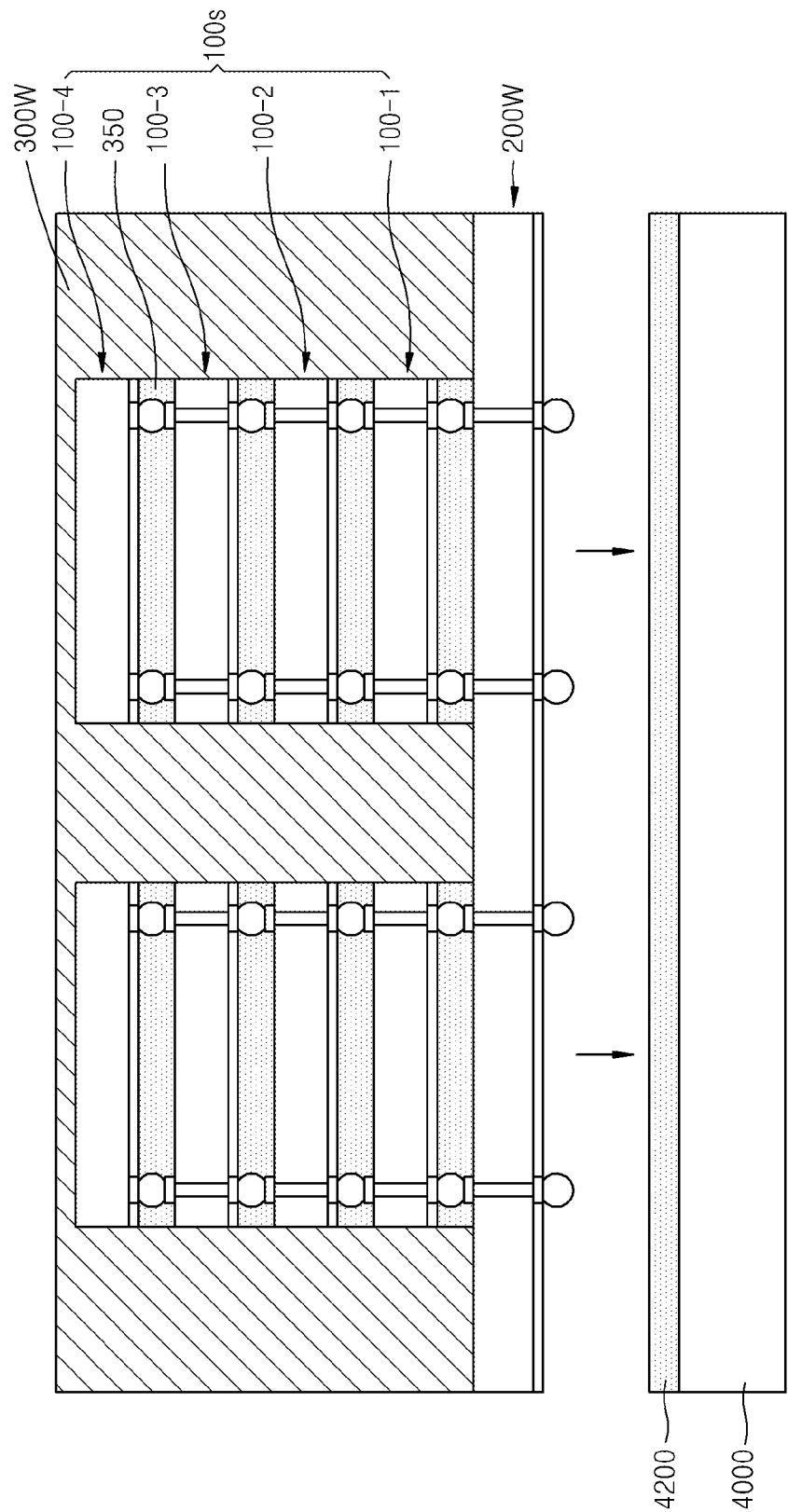

Referring to FIGS. 15E and 15F, the carrier substrate 4000 may be separated from the base wafer 200W. The adhesion member 4200 may be separated together with the carrier substrate 4000 or may be separated apart from the carrier substrate 4000. As the carrier substrate 4000 is removed, the connecting members 240 of the base wafer 200W may be exposed.

After the carrier substrate 4000 is separated, a second carrier substrate 5000 is attached to an upper surface of the internal seal 300W. The second carrier substrate 5000 may also be adhered to the internal seal 300W via an adhesion member 5200. In FIG. 15F, for convenience of understanding, the connecting members 240 of the base wafer 200W face upwards.

After the second carrier substrate 5000 is attached, each of the stacked chip portions 100s undergoes an electrical die sorting (EDS) test. The EDS test may be performed using a probe card 8000 or the like. The probe card 8000 may include a body portion 8400 and terminal pins 8200. The terminal pins 8200 may be, for example, pogo pins. The pogo pins may contact the corresponding connecting members 240 of the base wafer 200W and an electrical signal may be applied to the base wafer 200W so that an EDS test may be performed.

Through the EDS test, it is determined whether the stacked chip portions 100s are good or defective. As such, a determination as to whether the stacked chip portions 100s are good or defective is made through the EDS test performed on the stacked chip portions 100s, and stacked chip portions 100s determined to be defective or a semiconductor package including the defective stacked chip portions 100s are discarded. Accordingly, the semiconductor package 10000d according to the example embodiment may be a semiconductor package in which chips determined to be good through an EDS test are stacked. Accordingly, the semiconductor package 10000d according to the example embodiment may be referred to as a Known Good Die Stack (KGDS) package.

The semiconductor packages according to the example embodiment may undergo an EDS test after the completion of the semiconductor package 10000d, instead of after the processes of FIGS. 15E and 15F. In this case, the processes of FIGS. 15E and 15F may be omitted. When the processes of FIGS. 15E and 15F are omitted, a separation process based on singulation may be performed with the base wafer 200W attached onto the carrier substrate 4000 in the process of FIG. 15G.

Figure 15G:
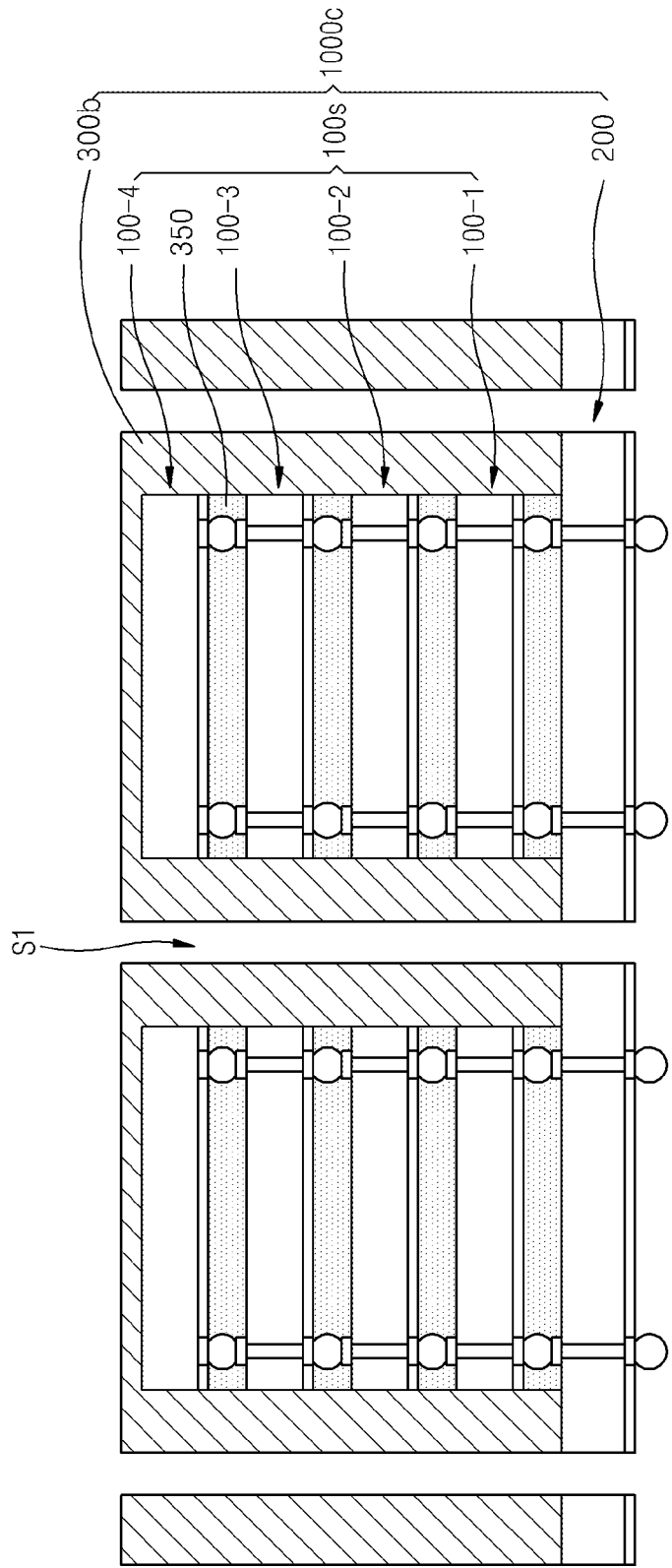

Referring to FIG. 15G, internal packages 1000c each including the internal substrate 200, the stacked chip portion 100s, and the internal seal 300b are separated through singulation after the EDS test. Although not illustrated, the separation may be performed by cutting from the upper surface of the internal seal 300W to a desirable (or alternatively, predetermined) part of the adhesion member 5200 on the second carrier substrate 5000 through sawing or laser sawing of the base wafer 200W attached onto the second carrier substrate 5000 and detaching the internal packages 1000c from the second carrier substrate 5000.

If the internal package 1000h of FIG. 10 is desired to be obtained, a method of cutting and separating two stacked chip portions 100s at a time may be performed. In FIG. 15G, S1 indicates a cut portion obtained by sawing.

Figure 15H:
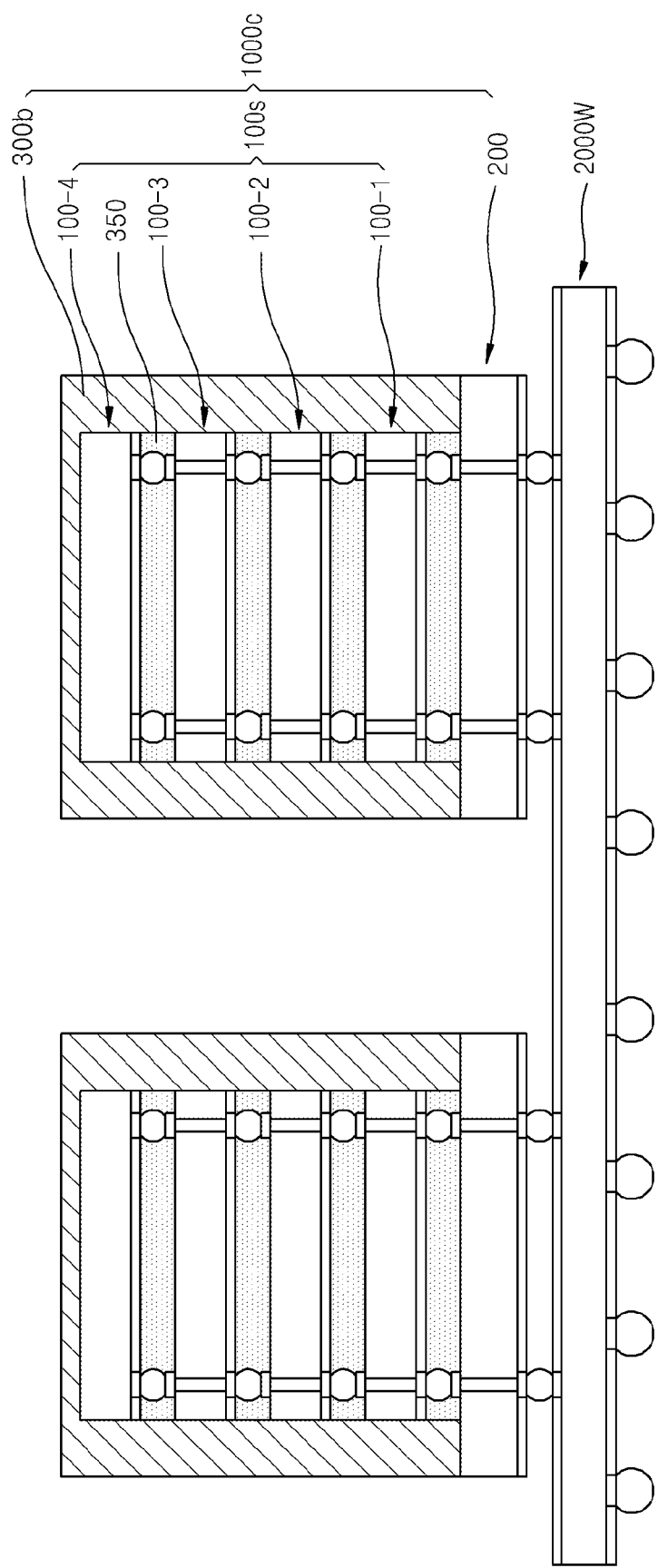

Referring to FIG. 15H, the plurality of internal packages 1000c obtained by the separation are stacked on a second base wafer 2000W. In other words, the internal packages 1000c are mounted on the second base wafer 2000W by combining the connecting members 240 of the internal substrate 200 with upper pads 2600 of the second base wafer 2000W.

The second base wafer 2000W corresponds to the external substrate 2000 of FIG. 1, and thus, may be formed based on a ceramic substrate, a PCB, an organic substrate, an interposer substrate, or the like. In some cases, the second base wafer 2000W may be formed of an active wafer.

To secure a sufficient space in a subsequent semiconductor package separating process, the internal packages 1000c may be mounted on the second base wafer 2000W while maintaining a sufficient interval between the internal packages 1000c in a horizontal direction.

Figure 15I:
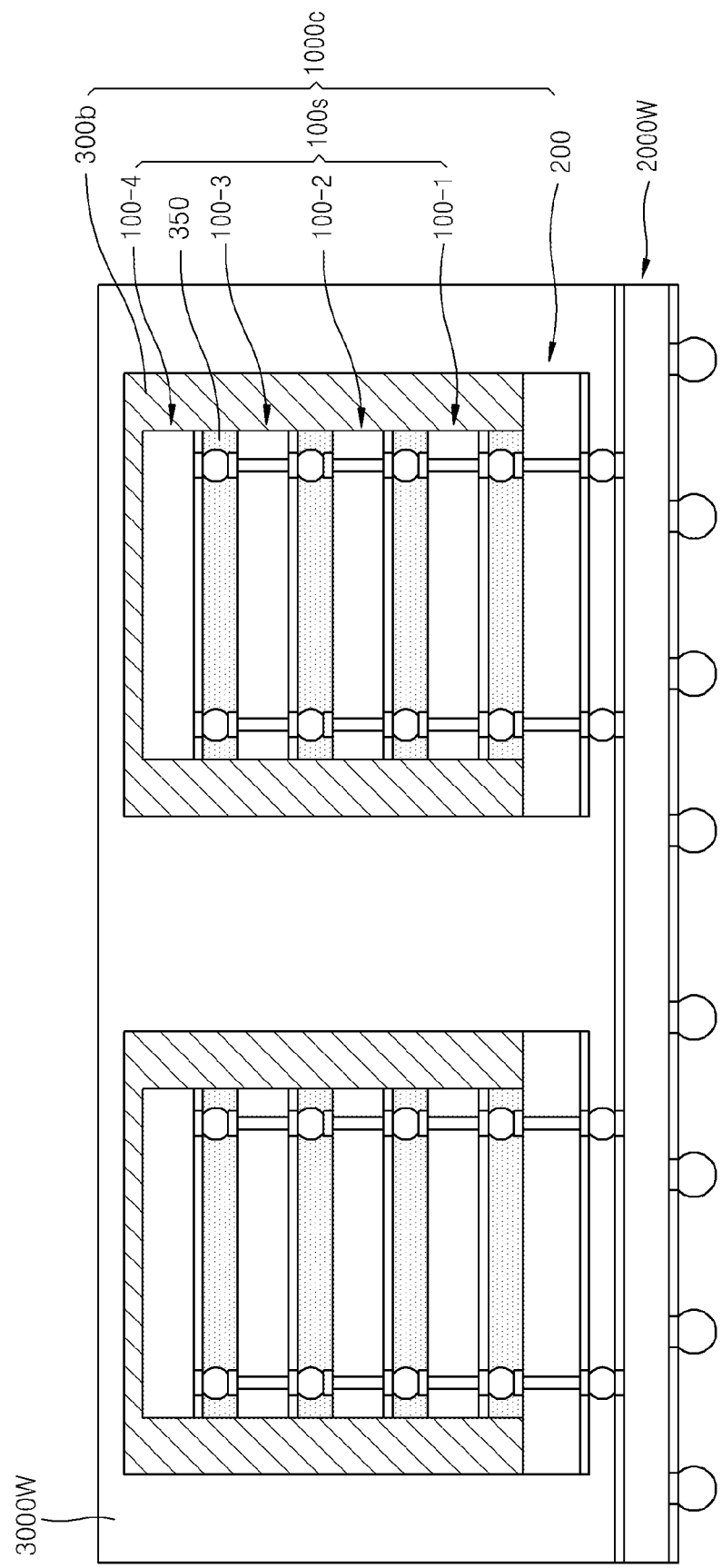

Referring to FIG. 15I, the internal packages 100c may be sealed by an external seal 3000W. The external seal 3000W may be formed of a material with a relatively larger Young's modulus. For example, the external seal 3000W may have a Young's modulus of several to several tens of GPa. The external seal 3000W may be formed of, for example, an epoxy-based material, a thermosetting material, a thermoplastic material, a UV curable material, or the like. The thermosetting material may include a phenol type, acid anhydride type, or amine type hardener and an acrylic polymer addition agent.

When the external seal 3000W is formed of resin, the resin may contain a relatively larger amount of filler.

When the external seal 3000W is formed through an MUF process, the external seal 3000W may fill a space between the internal package 1000c and the second base wafer 2000W. When an MUF process is not performed, an external underfill may fill the space between the internal packages 1000c and the second base wafer 2000W as illustrated in FIG. 3.

After the process of forming the external seal 3000W, a process of grinding the upper surface of the external seal 3000W may be performed if desired.

Figure 15J:
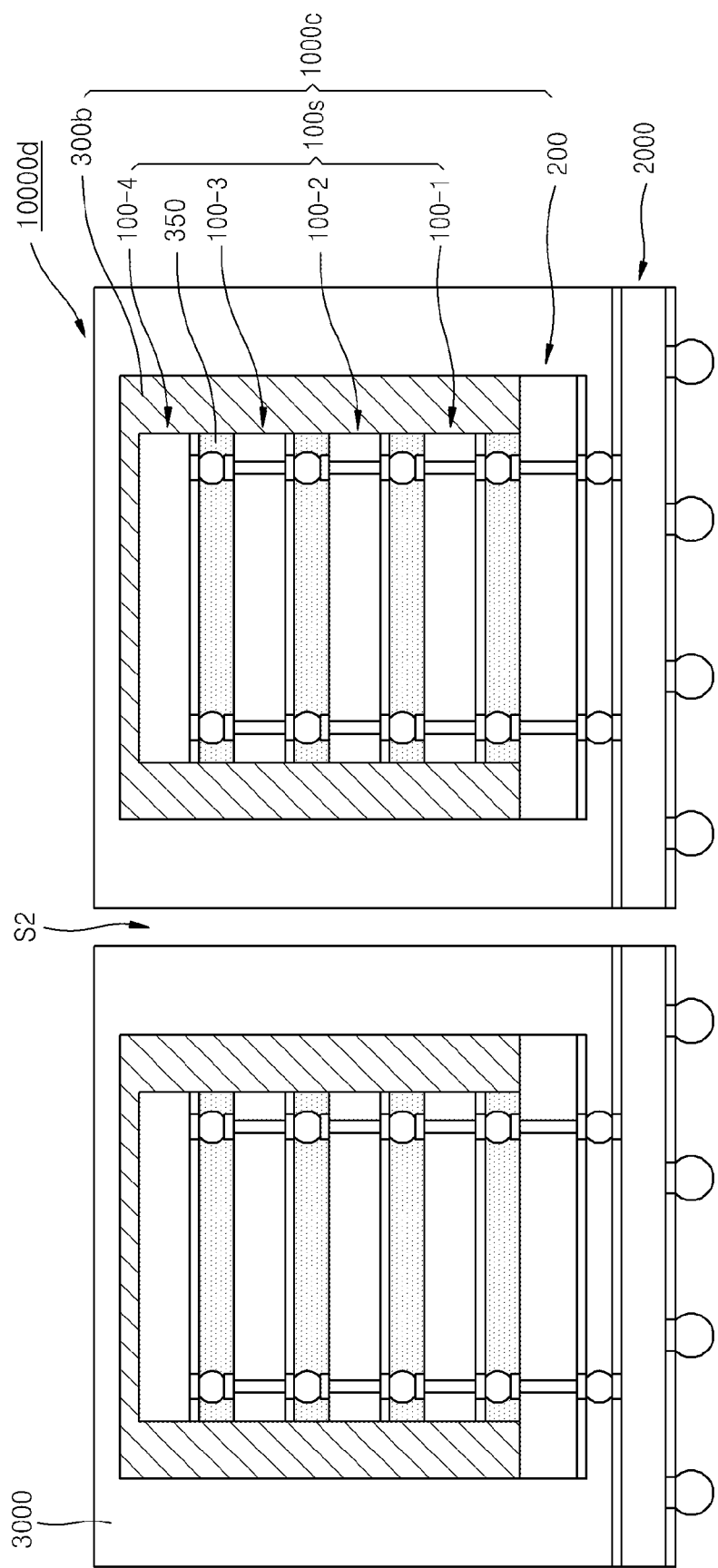

Referring to FIG. 15J, semiconductor packages 10000d each including the external substrate 2000, the internal package 1000c, and an external seal 3000 may be separated through singulation after the external seal 3000W is formed. In FIG. 15J, S2 indicates a cut portion obtained by sawing.

Although not illustrated, a carrier substrate may be attached to a bottom portion of the second based wafer 2000W after the process of FIG. 15H. According to the separation process of the example embodiment, the semiconductor package 10000d of FIG. 5A may be obtained by cutting from the upper surface of the external seal 3000W to a desirable (or alternatively, predetermined) part of an adhesion member on the carrier substrate by blade sawing or laser sawing and detaching the semiconductor package 10000d from the carrier substrate.

FIGS. 16A through 16E are sectional views illustrating a method of manufacturing the semiconductor package 10000f of FIG. 7, according to an example embodiment of the inventive concept. Like reference numerals refer to like components of the semiconductor chips in the semiconductor package 10000f of FIG. 7. Because the processes of FIGS. 15E through 15J may apply to the method according to this example embodiment, a description thereof will be omitted.

Figure 16A:
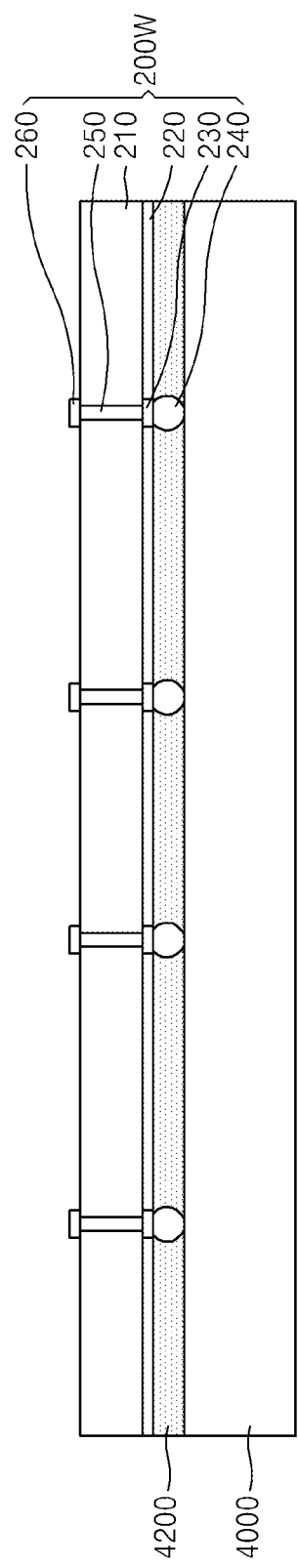
FIGS. 16A through 16E are sectional views illustrating a method of manufacturing the semiconductor package illustrated in FIG. 7, according to an example embodiment of the inventive concepts.

Referring to FIG. 16A, a base wafer 200W in which a plurality of TSVs 250 are formed may be prepared. The base wafer 200W may be prepared by being adhered onto a carrier substrate 4000 via an adhesion member 4200.

The carrier substrate 4000 may be formed of, for example, a silicon, germanium, silicon-germanium, gallium-arsenic (GaAs), glass, plastic, or ceramic substrate. The adhesion member 4200 may be, for example, an NCF, an ACF, an instant adhesive, a thermosetting adhesive, a laser hardening adhesive, an ultrasonic hardening adhesive, or an NCP. As illustrated in FIG. 16A, the base wafer 200W may be adhered to the carrier substrate 4000 so that a connecting member 240 faces the carrier substrate 4000.

The base wafer 200W is a wafer in which the plurality of TSVs 250 are formed on a wafer level. The base wafer 200W may be formed based on an active wafer or an interposer substrate. According to the present example embodiment, the base wafer 200W may be a wafer based on an active wafer. Accordingly, the base wafer 200W may include a plurality of semiconductor chips, and the semiconductor chips may each include corresponding TSVs 250.

Figure 16B:
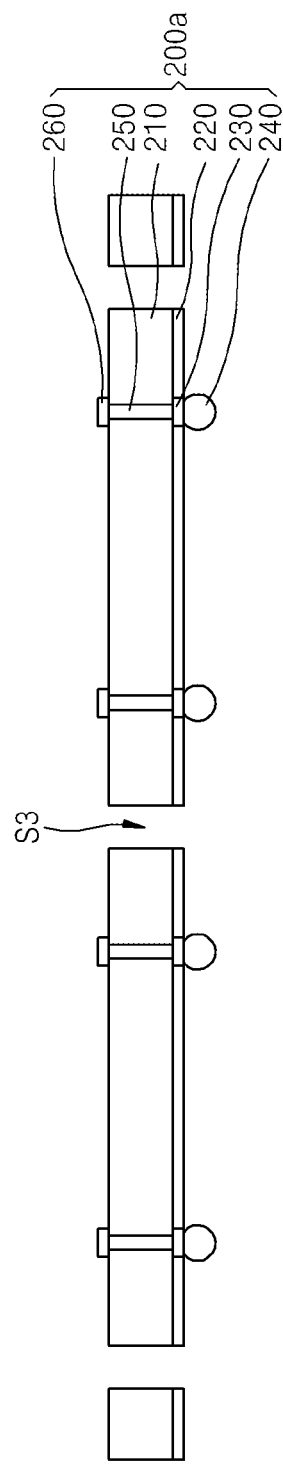

Referring to FIG. 16B, semiconductor chips may be obtained by sawing the base wafer 200W along a scribe lane (S/L). Each of the semiconductor chips may correspond to the internal substrate 200a of FIG. 7. Accordingly, for convenience of explanation, semiconductor chips obtained from a base wafer will be hereinafter referred to as "internal substrates". In FIG. 16B, S3 indicates a cut portion obtained by sawing.

Sawing may be performed only on the base wafer 200W and may not be performed on the carrier substrate 4000 that is below the base wafer 200W. In other words, sawing may be performed on only up to a desirable (or alternatively, predetermined) part of the adhesion member 4200. After the internal substrates 200a are obtained from the base wafer 200W, the carrier substrate 4000 may be removed. The adhesion member 4200 may be removed together with the carrier substrate 4000 or may be removed separately. In some cases, the adhesion member 4200 may not be removed because of a subsequent process.

Figure 16C:
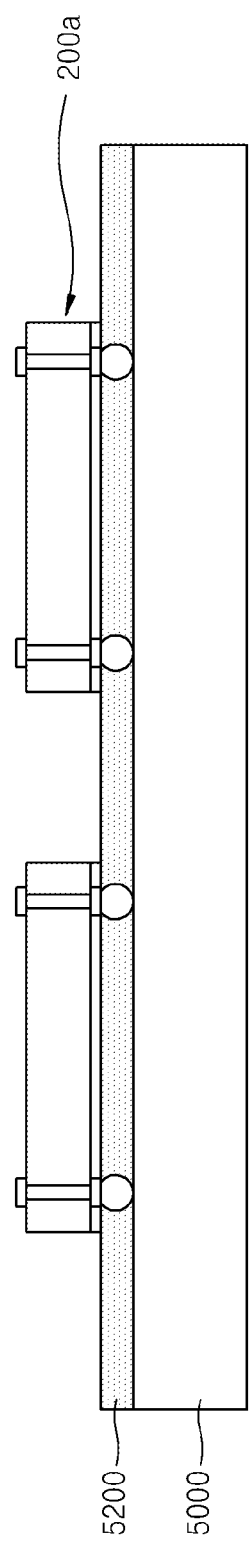

Referring to FIG. 16C, a second carrier substrate 5000 may be prepared. An adhesion member 5200 may be formed on the second carrier substrate 5000. The second carrier substrate 5000 may be formed of a silicon substrate, a germanium substrate, a silicon-germanium substrate, a gallium-arsenic (GaAs) substrate, a glass substrate, a plastic substrate, a ceramic substrate, or the like. According to the example embodiment, the second carrier substrate 5000 may be formed of a silicon substrate or a glass substrate. The adhesion member 5200 may be, for example, an NCF, an ACF, a UV film, an instant adhesive, a thermosetting adhesive, a laser hardening adhesive, an ultrasonic hardening adhesive, or an NCP.

The second carrier substrate 5000 may not necessarily be prepared after the internal substrate separating process with respect to the base wafer 200W illustrated in FIG. 16B. The second carrier substrate 5000 may be prepared before the preparation of the base wafer 200W. Alternatively, the second carrier substrate 5000 may be prepared after the preparation of the base wafer 200W and before the internal substrate separating process with respect to the base wafer 200W.

Before the adhesion member 5200 is formed, an align mark may be formed on the second carrier substrate 5000. The align mark is used to indicate locations on the second carrier substrate 5000 to which the internal substrates are to be attached later.

The internal substrates 200a may be attached onto the second carrier substrate 5000 by using the adhesion member 5200. The internal substrates 200a may be attached so that the connecting members 240 face the second carrier substrate 5000. The internal substrates 200a may be arranged by being attached at intervals of a desirable (or alternatively, predetermined) distance in a horizontal direction on the second carrier substrate 5000. The desirable (or alternatively, predetermined) distance may be suitably determined in consideration of the size of a semiconductor package which is to be finally formed.

According to the present example embodiment, the internal substrates 200a may be arranged at intervals of an arbitrary distance on a carrier substrate. Thus, limits on an underfill process and/or a sawing process due to the width of a scribe lane of a conventional base wafer may be addressed and/or physical, chemical damage due to pollution, destruction, delamination, or the like occurring due to exposure of a silicon on a lateral surface of a chip may be reduced or effectively prevented after completion of internal packages.

Figure 16D:
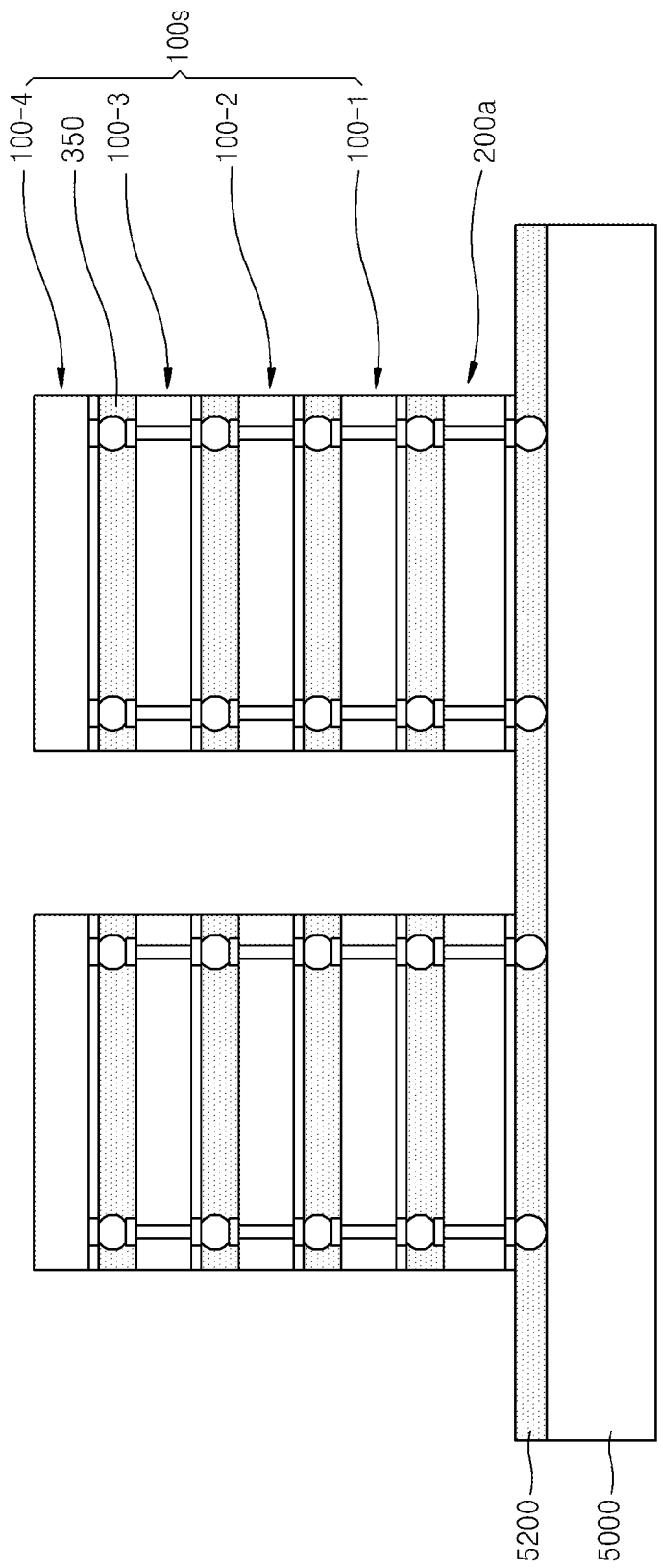

Referring to FIG. 16D, a plurality of stacked chip portions 100s may be formed by stacking a desirable (or alternatively predetermined) number of semiconductor chips on each of the internal substrates 200a. Although four (4) semiconductor chips, namely, the first, second, third, and fourth semiconductor chips 100-1, 100-2, 100-3, and 100-4, are stacked in each of the internal substrates 200a, the number of semiconductor chips stacked is not limited to four (4). The stacking of the semiconductor chips may be sequentially performed in a manner where a connecting member of an upper semiconductor chip is adhered to an upper pad of a lower semiconductor chip by thermal compression, and the semiconductor chips may be stacked by filling spaces between the semiconductor chips with the adhesion members 350.

The adhesion members 350 may be, for example, an NCF, an ACF, a UV film, an instant adhesive, a thermosetting adhesive, a laser hardening adhesive, an ultrasonic hardening adhesive, or an NCP, as described above. An underfill resin may be used instead of the adhesion members 350.

As illustrated in FIG. 16D, the internal substrates 200a may have the same size, e.g., the same plane area as the stacked semiconductor chips. In some cases, the internal substrates 200a may be larger than the semiconductor chips.

Figure 16E:
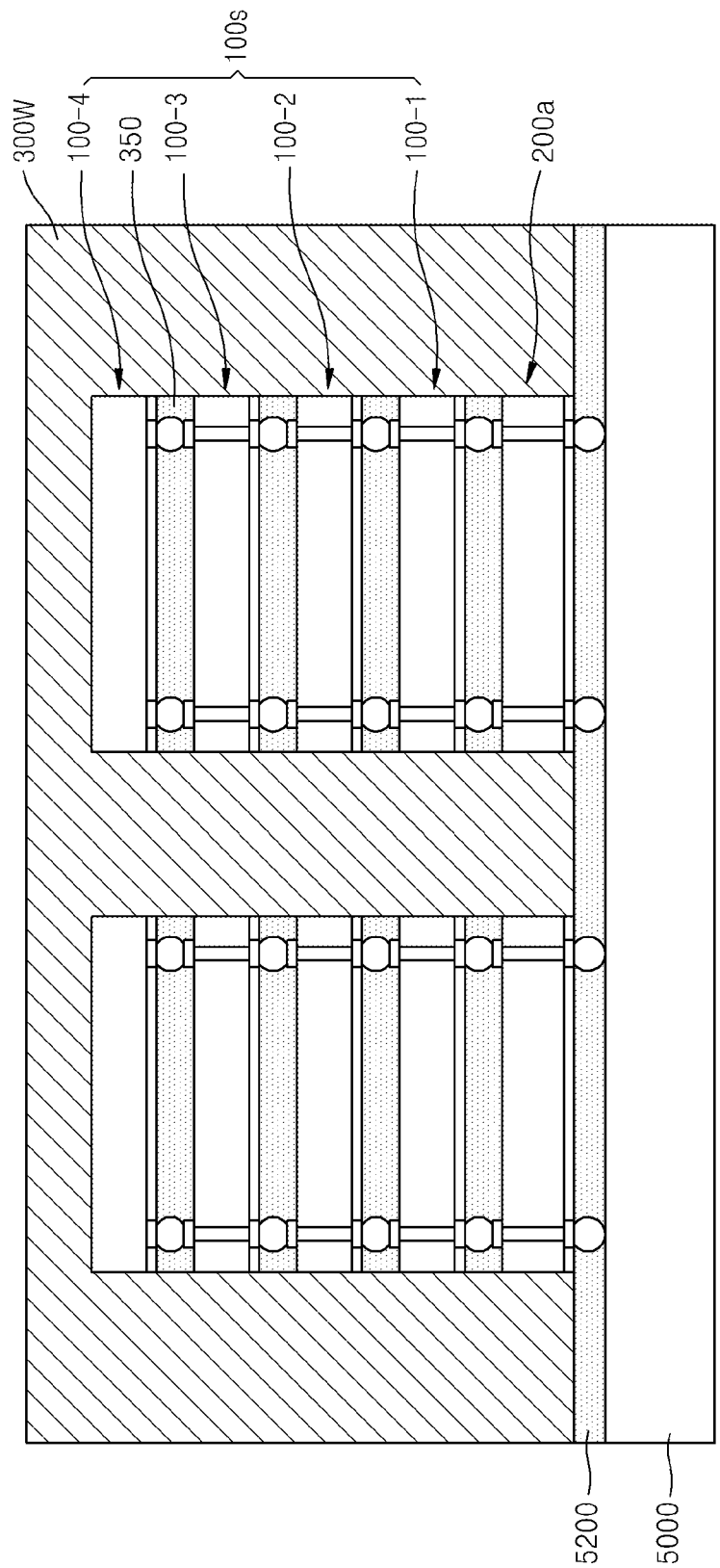

Referring to FIG. 16E, the stacked chip portions 100s may be sealed by an internal seal 300W. As described above, the internal seal 300W may be formed of a material with a relatively smaller Young's modulus.

Because the internal substrates 200a have the same size as the semiconductor chips, a lateral side of each internal substrate 200a and lateral sides of corresponding semiconductor chips may be sealed together by the internal seal 300W. Accordingly, an internal lateral side of the internal seal 300W may be on the same plane as the lateral side of each internal substrate 200a and the lateral sides of the corresponding semiconductor chips.

After the process of forming the internal seal 300W, a process of grinding the upper surface of the internal seal 300W may be performed. This grinding process may be omitted. To form a similar structure to the semiconductor package 10000a of FIG. 2, grinding may be performed to expose upper surfaces of the uppermost semiconductor chips, e.g., the fourth semiconductor chip 100-4 of the stacked chip portions 100s.

Thereafter, the same process of those of FIGS. 15E through 15J may be performed. After the process of FIG. 15J, the manufacture of the semiconductor package 10000f of FIG. 7 may be completed.

FIGS. 17A through 17I are sectional views illustrating a method of manufacturing the semiconductor package 10000k of FIG. 12, according to an example embodiment of the inventive concepts. Because the processes of FIGS. 16C and 16E and FIGS. 15E through 15J may apply to the method according to this example embodiment, a description thereof will be omitted.

Figure 17A:
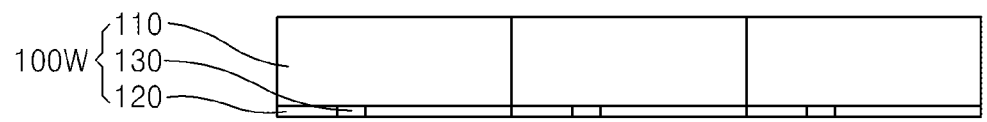
FIGS. 17A through 17I are sectional views illustrating a method of manufacturing the semiconductor package illustrated in FIG. 12, according to an example embodiment of the inventive concepts.

Referring to FIG. 17A, a base wafer 100W including a plurality of semiconductor chips 100a may be prepared. A chip pad 130 may be formed in each of the semiconductor chips 100a. The chip pad 130 may be formed of a metal, e.g., aluminum (Al), copper (Cu), gold (Au), nickel (Ni), or palladium (Pd), to have multiple layers or a single layer.

Figure 17B:
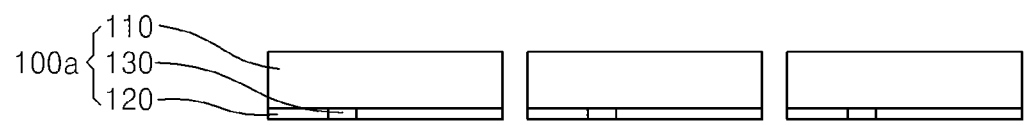

Referring to FIG. 17B, a Back-Lap (B/L) for polishing and removing a back-side surface of the base wafer 100W, e.g., upper surfaces of the semiconductor chips 100a of the base wafer 100W, may be performed. After the B/L, the base wafer 100W is divided into semiconductor chips 100a through singulation.

Figure 17C:

Referring to FIG. 17C, the semiconductor chips 100a may be attached to an adhesion member 6200 on a carrier substrate 6000. The surfaces of the semiconductor chips 100a that contact the adhesion member 6200 are surfaces on which the chip pads 130 are formed. The adhesion member 6200 may be, for example, a tape. The tape is a detachable tape that is easily detached later. For example, the tape may be a laminate or a UV film capable of being easily removed through UV radiation.

Before the attachment of the semiconductor chips 100a, a patterning process may be performed to facilitate an alignment of the semiconductor chips 100a on the tape. A pattern formed through the patterning process is an alignment mark for a die to be attached, e.g., the semiconductor chips 100a, and thus, the semiconductor chips 100a may be accurately attached to the location of the formed pattern. As a result, subsequent processes may be precisely conducted.

A distance between semiconductor chips to be attached onto the carrier substrate 6000 may be suitably controlled according to the size of a required semiconductor package. At present, the sizes of the semiconductor chips 100a has decreased, but the sizes of semiconductor packages are standardized. Thus, there is a limit in reducing the distance between semiconductor chips. For example, in a fan-out structure, a redistribution line may extend from a desirable (or alternatively, predetermined) portion of the lower surface of a semiconductor chip to an internal seal 300 where no semiconductor chips exist, and a connecting member is connected to the extension of the redistribution line.

Figure 17D:
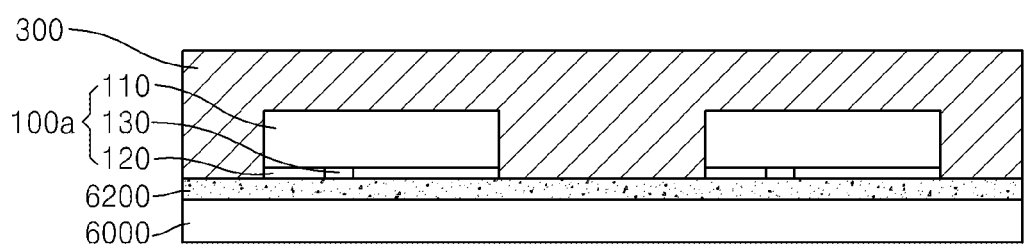

Referring to FIG. 17D, after the semiconductor chips 100a are attached, an internal seal 300 may seal the semiconductor chips 100a. Because a lower surface of each semiconductor chip 100a on which the chip pad 130 is formed is attached to the adhesion member 6200 of the carrier substrate 6000, the lateral surface and the upper surface of the semiconductor chip 100a may be surrounded by the internal seal 300. However, the lower surface of the semiconductor chip 100a may not be sealed by the internal seal 300. The internal seal 300 may be the same as the internal seal 300 described above with reference to FIG. 1.

Figure 17E:
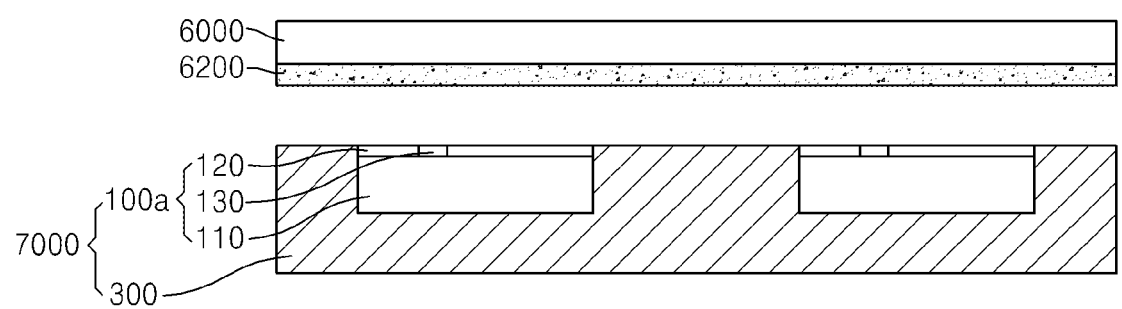

Referring to FIG. 17E, after the internal seal 300 is formed, a package complex 7000, including the semiconductor chips 100a and the internal seal 300, may be separated from the carrier substrate 6000. After this separation, the lower surfaces of the semiconductor chips 100a may be exposed from the internal seal 300. Hereinafter, the package complex 7000 is illustrated upside down for convenience of understanding. In other words, the lower surfaces of the semiconductor chips 100a on which the chip pads 130 are formed face upwards.

Figure 17F:
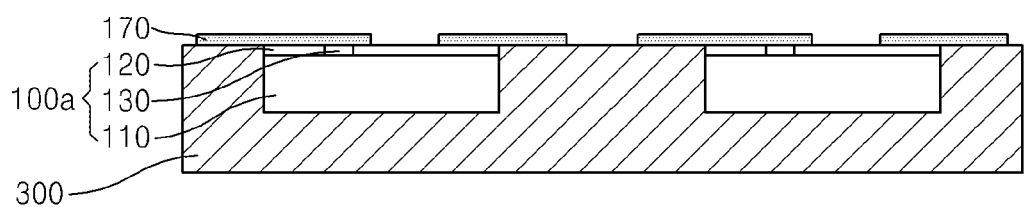

Referring to FIG. 17F, the redistribution lines 170 may be formed on the lower surfaces of the semiconductor chips 100a and some portions of the internal seal 300. The redistribution lines 170 may be formed of a conductive material, for example, a metal such as silver (Ag), copper (Cu), gold (Au), nickel (Ni), or palladium (Pd), by using a lithography method or a printing method. When the redistribution lines 170 are formed by printing method, an imprinting method, e.g., roll-to-roll printing and a plating method may be used. For example, the redistribution lines 170 may be formed by forming a seed metal by roll-to-roll printing and forming a plated metal on the seed metal. The redistribution lines 170 may be formed as multiple layers or a single layer.

Figure 17G:
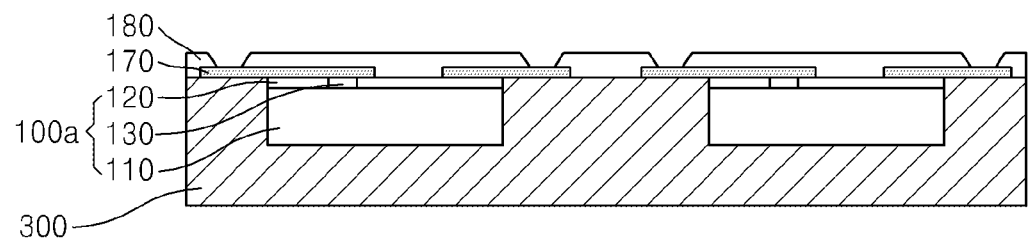
Figure 17H:
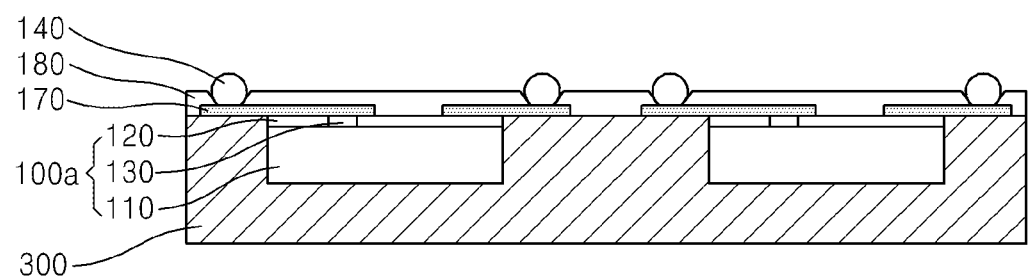

Referring to FIG. 17G, after the formation of the redistribution lines 170, the protective layer 180 may be formed by lithography or printing. When the protective layer 180 is formed by printing, the protective layer 180 may be formed of a solder-resist by imprinting, e.g., screen-printing.

The protective layer 180 may be formed on upper surfaces of the redistribution lines 170, a portion of the lower surfaces of the semiconductor chips 100a on which the redistribution lines 170 are not formed, and portions of the upper surface of the internal seal 300 on which the redistribution lines 170 are not formed. The protective layer 180 may be formed of polymer, and may include openings through which desirable (or alternatively, predetermined) parts of the redistribution lines 170 are exposed. Although the openings may expose only the upper surfaces of the redistribution lines 170 in the example embodiment, lateral surfaces of the redistribution lines 170 may also be exposed in some cases. The protective layer 180 may have a thickness of about 5 to about 20 RE Referring to FIG. 17H, the connecting members 140 may be formed in the openings of the protective layer 180. The connecting members 140 may be, for example, solder balls. The connecting members 140 may constitute a fan-out structured ball grid array (BGA). According to the example embodiment, solder balls may be disposed directly on the redistribution lines 170. The redistribution lines 170 may be formed as an Ag/Ni/Au multi-layer to achieve, for example, improvement of wetting of solder and diffusion reduction or prevention.

Although the connecting members 140 are formed in a fan-out structure by being disposed outside the semiconductor chips 100a in the example embodiment, the connecting members 140 may be formed in a fan-in structure as in the semiconductor package 10000J of FIG. 11. The connecting member 140 may also be formed in a combination of a fan-in structure and a fan-out structure in some cases.

Figure 17I:
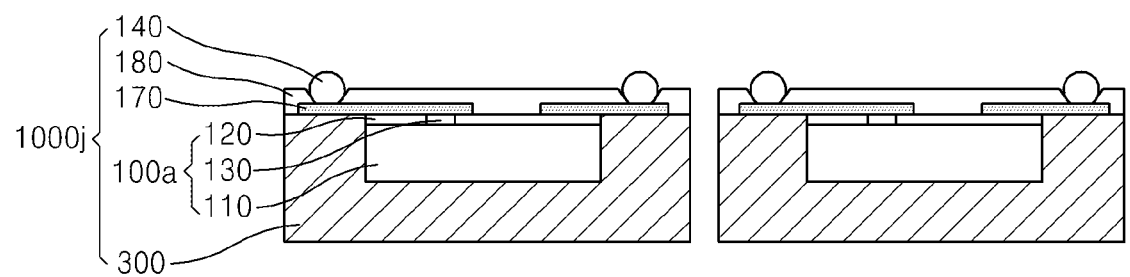

Referring to FIG. 17I, after forming the connecting members 140, a separation process of singulating the package complex 7000 into individual internal packages 1000j may be performed. Through this separation process based on singulation, the manufacture of the internal packages 1000j in the semiconductor package 10000k of FIG. 12 may be completed. Thereafter, the processes of FIGS. 16C and 16E and FIGS. 15E through 15J may be performed to complete the manufacture of the semiconductor package 10000k of FIG. 12. According to the example embodiment, a process of stacking a plurality of semiconductor chips as show in FIG. 16D may not be performed.

Figure 18:
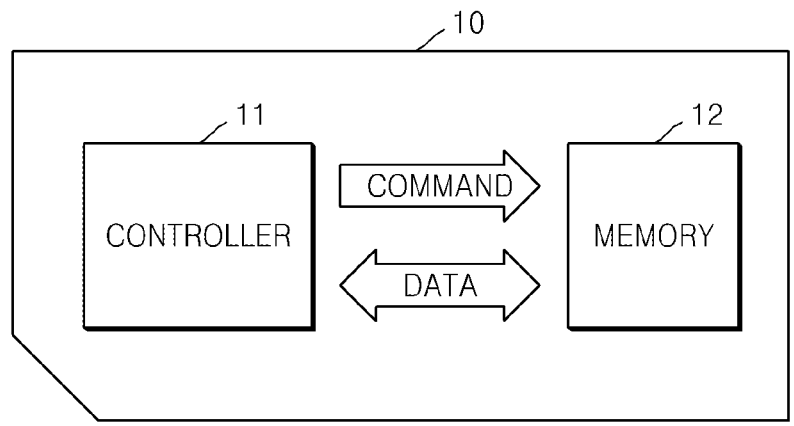
FIG. 18 is a schematic diagram of a memory card including a semiconductor package according to example embodiments of the inventive concepts.

FIG. 18 is a schematic diagram of a memory card 10 including a semiconductor package according to example embodiments of the inventive concepts.

Referring to FIG. 18, a controller 11 and a memory 12 may be arranged in the memory card 10 so as to exchange electrical signals with each other. For example, when a command is issued by the controller 11, the memory 12 may transmit data. The controller 11 and/or the memory 12 may include a semiconductor package according to example embodiments of the inventive concepts. The memory 12 may include a memory array (not shown) or a memory array bank (not shown).

The memory card 10 may be used in a memory device such as a card, for example, a memory stick card, a smart media (SM) card, a secure digital (SD) card, a mini SD card, or a multi media card (MMC).

Figure 19:
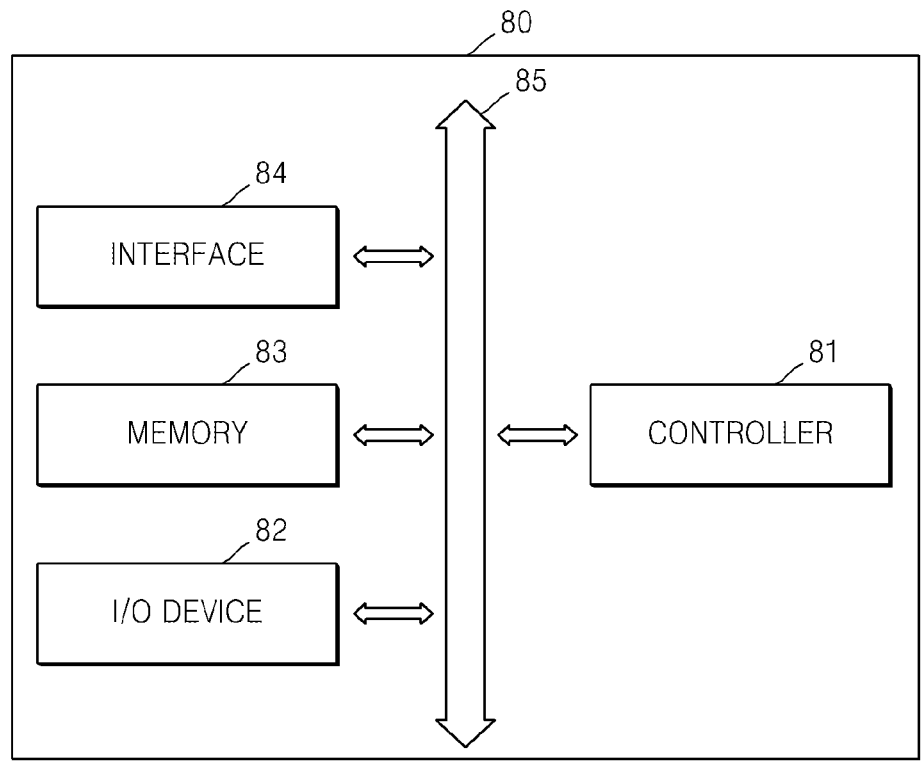
FIG. 19 is a block diagram of an electronic system including a semiconductor package according to example embodiments of the inventive concepts.

FIG. 19 is a block diagram of an electronic system 80 including a semiconductor package according to example embodiments of the inventive concepts.

Referring to FIG. 19, the electronic system 80 may include a controller 81, an input/output (I/0) device 82, a memory 83, and an interface 84. The electronic system 80 may be a system that transmits or receives information or a mobile system. The mobile system may be a PDA, a portable computer, a web tablet, a wireless phone, a mobile phone, a digital music player, or a memory card.

The controller 81 may execute a program and control the electronic system 80. The controller 81 may be a microprocessor, a digital signal processor, a microcontroller, or a device similar to these devices. The I/0 device 82 may be used to input or output data of the electronic system 80.

The electronic system 80 may be connected to an external device, for example, a personal computer or a network, via the I/0 device 82, and thus, may exchange data with the external device. The I/O device 82 may be a keypad, a keyboard, or a display. The memory 83 may store a code and/or data for operating the controller 81, and/or store data processed by the controller 81. The controller 81 and the memory 83 may include a semiconductor package according to example embodiments of the inventive concepts. The interface 84 may be a data transmission path between the electronic system 80 and another external device. The controller 81, the I/O device 82, the memory 83, and the interface 84 may communicate with each other via a bus 85.

For example, the electronic system 80 may be used in a mobile phone, an MP3 player, a navigation device, a portable multimedia player (PMP), a solid state disk (SSD), or household appliances.

Figure 20:
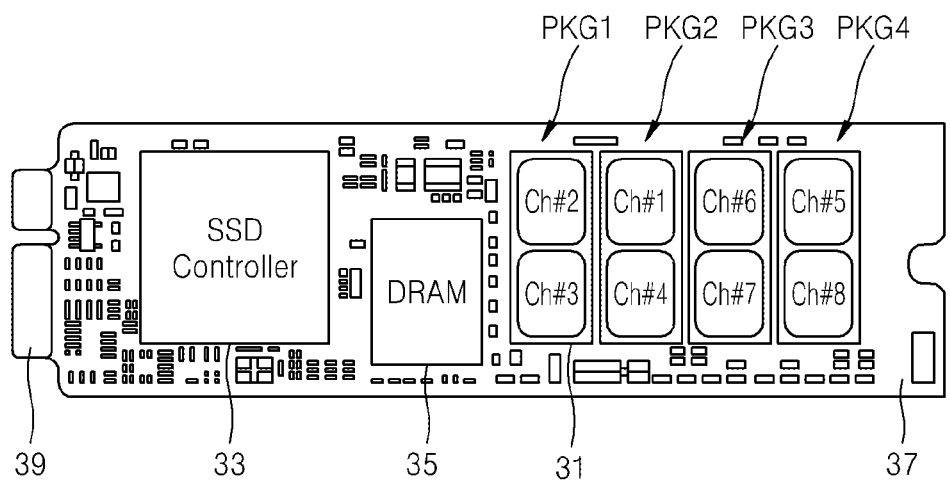
FIG. 20 is a cross-sectional view of a solid state drive (SSD) device to which a semiconductor package according to example embodiments of the inventive concepts is applied.

FIG. 20 is a cross-sectional view of a SSD device 30 to which a semiconductor package according to example embodiments of the inventive concepts may be applied. The electronic system 80 of FIG. 19 may be applied to the SSD device 30.

Referring to FIG. 20, the SSD device 30 may include a memory package 31, an SSD controller 33, a DRAM 35, and a main board 37.

The memory package 31, the SSD controller 33, the DRAM 35, and the like may include a semiconductor package according to example embodiments of the inventive concepts. An SSD device using semiconductor packages with other structures that use an internal seal and an external seal with different Young's moduli may also be included in the inventive concepts.

The memory package 31 may be mounted on the main board 37 via the external connecting member 2400 of FIG. 1 and may include four (4) memory packages PKG1, PKG2, PKG3, and PKG4, as illustrated in FIG. 20. However, more than four (4) memory packages 31 may be mounted according to a channel support state of the SSD controller 33. When memory package 31 is formed of multiple channels, the number of memory packages 31 that are mounted may be reduced to less than four (4).

The memory packages 31 may be mounted on the main board 37 via the external connecting member 2400 such as solder balls in a BGA manner. However, the memory packages 31 may be mounted in other manners. For example, the memory packages 31 may be mounted in a pin grid array (PGA) manner, a tape carrier package (TCP) manner, a chip-on-board (COB) manner, a quad flat non-leaded (QFN) manner, a quad flat package (QFP) manner, or the like.

The SSD controller 33 may include eight (8) channels. The eight (8) channels may be connected to corresponding channels of the four (4) memory packages PKG1, PKG2, PKG3, and PKG4 in a one-to-one correspondence to control the semiconductor chips included in the memory packages 31.

The SSD controller 33 may include a program that allows signal communication with an external device in a method based on a serial advanced technology attachment (SATA) standard, a parallel advanced technology attachment (PATA) standard, or a small computer system interface (SCSI) standard. Examples of the SATA standard may include not only the so-called SATA-1 standard but also all SATA-based standards, e.g., SATA-2, SATA-3, and external SATA (e-SATA). Examples of the PATA standard may include all integrated drive electronics (IDE)-based standards such as IDE and enhanced-IDE (E-IDE).

The SSD controller 33 may perform EEC, FTL, or the like. The SSD controller 33 may also be mounted in a package form on the main board 37. The SSD controller 33 may be mounted on the main board 37 in a BGA manner, a PGA manner, a TCP manner, a COB manner, a QFN manner, a QFP manner, or the like, like the memory package 31.

The DRAM 35 is an auxiliary memory device, and may serve as a buffer during data exchange between the SSD controller 33 and the memory package 31. The DRAM 35 may also be mounted on the main board 37 in any of various manners, e.g., the BGA manner, the PGA manner, the TCP manner, the COB manner, the QFN manner, the QFP manner, and the like.

The main board 37 may be a PCB, a flexible PCB, an organic substrate, a ceramic substrate, a tape substrate, or the like. The main board 37 may include a core board (not shown) having an upper surface and a lower surface, and a resin layer (not shown) formed on each of the upper surface and the lower surface. The resin layers may be formed in a multi-layered structure, and a signal layer, a ground layer, or a power layer that forms a wiring pattern may be interposed between the multiple layers of the multi-layered structure. A special wiring pattern may be formed on each resin layer. In FIG. 20, fine patterns shown on the main board 37 may denote a wiring pattern or a plurality of passive elements. An interface 39 for communication with an external device may be formed on one side, for example, the left side, of the main board 37.

Figure 21:
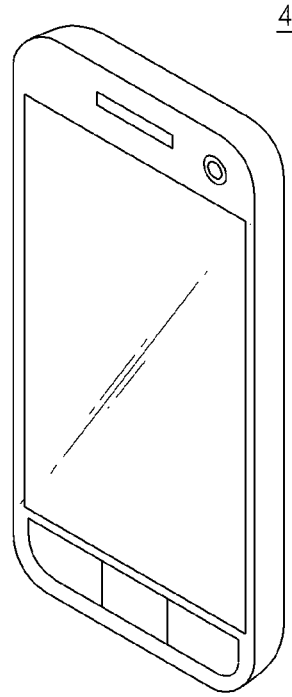
FIG. 21 is a schematic perspective view of an electronic device to which a semiconductor package according to example embodiments of the inventive concepts is applied.

FIG. 21 is a schematic perspective view of an electronic device to which a semiconductor package according example embodiments of the inventive concepts is applied.

FIG. 21 illustrates a mobile phone 40 as the electronic device to which the electronic system 80 of FIG. 20 is applied. The electronic system 80 may also be used in portable notebooks, MP3 players, navigation devices, SSDs, cars, or household appliances.

In a semiconductor package and a manufacturing method thereof according to the inventive concepts, handling difficulties and warpage problems generated during a packaging process may be addressed by forming an internal seal of an internal package and an external seal outside the internal package of materials having different Young's moduli. In other words, the internal seal may be formed of a material with a smaller Young's modulus and the external seal may be formed of a material with a larger Young's modulus in the packaging process.

Accordingly, the yield of a semiconductor process may be improved, and the reliability of final semiconductor packages may also be improved.

While the inventive concept has been particularly shown and described with reference to exemplary embodiments thereof, it will be understood that various changes in form and details may be made therein without departing from the spirit and scope of the following claims.

What is claimed is:

1. A method of manufacturing a semiconductor package, the method comprising:
  forming an internal package by sealing at least one semiconductor chip with an internal seal;
  mounting the internal package on an external substrate; and
  sealing the internal package with an external seal having a larger Young's modulus than the internal seal, wherein
  the forming of an internal package includes,
    forming an internal substrate, the internal substrate having a through silicon via (TSV),
    forming a plurality of stacked chip portions on the internal substrate, each of the plurality of stacked chip portions including a stack of semiconductor chips,
    sealing the plurality of stacked chip portions by using the internal seal, and
    dividing the sealed plurality of stacked chip portions into individual internal packages, each of the internal packages including at least one of the stacked chip portions.

2. The method of claim 1, wherein the Young's modulus of the internal seal is no more than 1/10 of the Young's modulus of the external seal.

3. The method of claim 1, wherein each of the internal packages comprises at least two stacked chip portions.

4. A method of manufacturing a semiconductor package, the method comprising:
- forming an internal package by sealing at least one semiconductor chip with an internal seal;
- mounting the internal package on an external substrate; and
- sealing the internal package with an external seal having a larger Young's modulus than the internal seal, wherein the forming an internal package includes,
    - preparing a base wafer, the base wafer including a through silicon via (TSV) and a connecting member, the connecting member on a lower surface of the base wafer and connected to the TSV,
    - adhering the base wafer onto a first carrier substrate such that the lower surface of the base wafer faces the first carrier substrate,
    - forming a plurality of stacked chip portions, each of the plurality of stacked chip portions including a stack of semiconductor chips on an upper surface of the base wafer,
    - sealing the plurality of stacked chip portions with the internal seal, and
    - exposing the connecting member by detaching the first carrier substrate from the base wafer.

5. The method of claim 4, wherein the forming an internal package further includes,
- adhering a second carrier substrate to upper surfaces of at least one of the plurality of stacked chip portions and the internal seal,
- performing an Electrical Die Sort (EDS) test on the stacked chip portions via the connecting member,
- dividing the sealed stacked chip portions into individual internal packages, each of the individual packages including at least one of the plurality of the stacked chip portions, and
- detaching the internal packages from the second carrier substrate.

6. A method of manufacturing a semiconductor package, the method comprising:
- forming an internal package by sealing at least one semiconductor chip with an internal seal,
- mounting the internal package on an external substrate; and
- sealing the internal package with an external seal having a larger Young's modulus than the internal seal, wherein the forming an internal package includes,
    - preparing a base wafer, the base wafer including a plurality of unit internal substrates, each of the unit internal substrates including at least one through silicon via (TSV) and at least one connecting member, the at least one connecting member on a lower surface of each of the unit internal substrates,
    - dividing the base wafer into the plurality of unit internal substrates,
    - mounting at least one of the unit internal substrates on a first carrier substrate such that the at least one connecting member faces the first carrier substrate,
    - forming at least one stacked chip portion on the at least one of the unit internal substrates, the at least one stacked chip portion including the at least one semiconductor chip,
    - sealing the at least one of the unit internal substrates and the at least one stacked chip portion with the internal seal, and
    - exposing the connecting member by detaching the first carrier substrate from the unit internal substrates.

7. The method of claim 6, wherein the forming an internal package further includes,
- adhering a second carrier substrate to upper surfaces of at least one of the stacked chip portion and the internal seal,
- performing an Electrical Die Sort (EDS) test on the at least one stacked chip portion via the at least one connecting member,
- dividing the sealed unit internal substrate and the sealed at least one stacked chip portion into individual internal packages, each of the individual internal packages including the at least one stacked chip portion, and
- detaching the internal packages from the second carrier substrate.

8. The method of claim 1, wherein when the at least one semiconductor chip corresponds to a plurality of semiconductor chips,
- the forming of an internal package includes,
    - forming a first stacked chip portion and a second stacked chip portion spaced apart from the first stacked chip portion, each of the first and second stacked chip portions formed by stacking some of the semiconductor chips on an internal substrate; and
    - the internal package includes the first stacked chip portion and the second stacked chip portion.

9. The method of claim 1, wherein, in the forming an internal package, the internal package is a wafer level package.

10. The method of claim 1, wherein, in the forming an internal package, the internal package has a fan-in or fan-out structure.

11. The method of claim 1, the method further comprising:
- mounting a plurality of the internal packages on an external substrate;
- sealing the plurality of the internal packages with an external seal having a larger Young's modulus than the internal seal; and
- dividing the sealed internal packages into individual semiconductor packages, each of the semiconductor packages including at least one of the plurality of the internal packages.

12. The method of claim 11, further comprising:
performing an Electrical Die Sort (EDS) test on the plurality of the internal packages before the dividing the sealed internal packages into individual internal packages.

13. The method of claim 11, wherein, in the dividing the sealed stacked chip portions into individual internal packages, the internal package includes,
at least two stacked chip portions, the at least two stacked chip portions spaced apart from each other on the internal substrate.

* * * * *